(12) United States Patent
Paak et al.

(10) Patent No.: US 11,211,490 B2
(45) Date of Patent: Dec. 28, 2021

(54) FINFETS HAVING STEP SIDED CONTACT PLUGS AND METHODS OF MANUFACTURING THE SAME

(71) Applicant: Samsung Electronics Co., Ltd., Suwon-si (KR)

(72) Inventors: Sun Hom Paak, Seoul (KR); Sung Min Kim, Incheon (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/794,326

(22) Filed: Feb. 19, 2020

(65) Prior Publication Data

US 2020/0185524 A1 Jun. 11, 2020

Related U.S. Application Data

(63) Continuation of application No. 14/989,646, filed on Jan. 6, 2016, now Pat. No. 10,686,073.

(30) Foreign Application Priority Data

Mar. 2, 2015 (KR) .................. 10-2015-0029162

(51) Int. Cl.
| | | |
|---|---|---|
| *H01L 29/78* | (2006.01) | |
| *H01L 29/06* | (2006.01) | |
| *H01L 29/08* | (2006.01) | |
| *H01L 29/165* | (2006.01) | |
| *H01L 29/417* | (2006.01) | |
| *H01L 23/485* | (2006.01) | |

(52) U.S. Cl.
CPC ........ *H01L 29/7845* (2013.01); *H01L 23/485* (2013.01); *H01L 29/0653* (2013.01); *H01L 29/0847* (2013.01); *H01L 29/165* (2013.01); *H01L 29/41791* (2013.01)

(58) Field of Classification Search
CPC ............. H01L 29/7845; H01L 29/0653; H01L 29/0847; H01L 29/165; H01L 29/41791; H01L 29/485
See application file for complete search history.

(56) References Cited

U.S. PATENT DOCUMENTS

| | | | |
|---|---|---|---|
| 7,608,890 B2 | 10/2009 | Yagishita | |
| 7,898,041 B2 | 3/2011 | Radosavljevic et al. | |
| 8,735,984 B2 | 5/2014 | Yin et al. | |
| 8,753,964 B2 | 6/2014 | Bryant et al. | |
| 8,772,109 B2 | 7/2014 | Colinge | |
| 8,791,509 B2 | 7/2014 | Beyer et al. | |
| 8,796,093 B1 | 8/2014 | Cheng et al. | |

(Continued)

FOREIGN PATENT DOCUMENTS

| | | |
|---|---|---|
| KR | 2001-0054168 | 7/2001 |
| KR | 2002-0057753 | 7/2002 |

(Continued)

*Primary Examiner* — Vongsavanh Sengdara
(74) *Attorney, Agent, or Firm* — Myers Bigel, P.A.

(57) ABSTRACT

A semiconductor device includes an active fin extending in a first direction on a substrate, a gate electrode intersecting the active fin and extending in a second direction, source/drain regions disposed on the active fin on both sides of the gate electrode, and a contact plug disposed on the source/drain regions. The contact plug has at least one side extending in the second direction which has a step portion having a step shape.

20 Claims, 20 Drawing Sheets

(56) References Cited

U.S. PATENT DOCUMENTS

| | | |
|---|---|---|
| 2007/0023822 A1 | 2/2007 | Sung et al. |
| 2009/0014796 A1 | 1/2009 | Liaw |
| 2010/0133614 A1 | 6/2010 | Beyer et al. |
| 2011/0201167 A1 | 8/2011 | Satonaka et al. |
| 2012/0193712 A1 | 8/2012 | Bryant et al. |
| 2013/0221414 A1 | 8/2013 | Zhao et al. |
| 2014/0042500 A1* | 2/2014 | Wann .................. H01L 29/165 257/288 |
| 2014/0056072 A1 | 2/2014 | Hung |
| 2014/0203370 A1 | 7/2014 | Maeda et al. |
| 2014/0273369 A1* | 9/2014 | Wei .................. H01L 29/66606 438/232 |
| 2015/0035023 A1 | 2/2015 | Kim et al. |
| 2015/0041918 A1 | 2/2015 | Wann et al. |
| 2015/0084134 A1* | 3/2015 | Lin .................. H01L 27/027 257/384 |
| 2015/0137181 A1* | 5/2015 | Basker .............. H01L 29/41791 257/192 |
| 2015/0187905 A1* | 7/2015 | Cai .................. H01L 29/6681 257/288 |
| 2015/0295089 A1* | 10/2015 | Huang .............. H01L 29/66795 257/401 |
| 2016/0049332 A1 | 2/2016 | Xie et al. |
| 2016/0190325 A1* | 6/2016 | Liu .................. H01L 29/785 257/401 |

FOREIGN PATENT DOCUMENTS

| | | |
|---|---|---|
| KR | 10-0559030 | 6/2006 |
| KR | 10-20110097886 A | 8/2011 |
| KR | 10-20150015778 A | 2/2015 |
| KR | 10-20150018343 A | 2/2015 |

* cited by examiner

FINFETS HAVING STEP SIDED CONTACT PLUGS AND METHODS OF MANUFACTURING THE SAME

CROSS-REFERENCE TO RELATED APPLICATION

This application is a continuation of U.S. patent application Ser. No. 14/989,646, filed Jan. 6, 2016, which claims the priority and benefit of Korean Patent Application No. 10-2015-0029162 filed on Mar. 2, 2015, with the Korean Intellectual Property Office, the disclosure of which is incorporated herein by reference.

BACKGROUND

The present inventive concepts relate to a semiconductor device and a method of manufacturing the same.

As demand for high performance, high speed, and/or multiple functions and the like of semiconductor devices increases, the degree of integration of semiconductor devices has similarly risen. In the manufacturing of semiconductor devices having a fine pattern corresponding to higher integration trends in semiconductor devices, implementing patterns having a fine width or spacing are desired. Furthermore, in order to overcome the limitations of element characteristics of a planar metal oxide semiconductor FET (MOSFET), efforts to develop semiconductor devices which include FinFETs provided with a three-dimensional channel structure are underway.

SUMMARY

According to an aspect of the present inventive concepts, a semiconductor device may include an active fin extending in a first direction on a substrate, a gate electrode intersecting the active fin and extending in a second direction that is different from the first direction, a source/drain region disposed on the active fin on both sides of the gate electrode, and a contact plug disposed on the source/drain region on one side of the gate electrode and extending in the second direction. The contact plug has a side extending in the second direction which has a step portion having a step shape.

In other embodiments, the contact plug side has a plurality of line segments when viewed in cross-section.

The step portion may be located outwardly of the source/drain region on the one side of the gate electrode in the second direction.

The side of the contact plug may have a step surface extending parallel to an upper surface of the substrate by the step portion.

The side of the contact plug in the upper and lower portions of the step surface may have a gradient with respect to the upper surface of the substrate.

The semiconductor device may further include a first interlayer insulating layer on, and in some embodiments covering, the gate electrode and the source/drain regions, and a second interlayer insulating layer on the first interlayer insulating layer. The step surface may be located within the second interlayer insulating layer.

The first interlayer insulating layer may comprise a tonen silazene (TOZ) film, and the second interlayer insulating layer may comprise a tetraethyl ortho silicate (TEOS) film.

The contact plug may have an elongated shape extending in the second direction.

The contact plug may have a first length in the first direction and a second length in the second direction. The second length may be three or more times greater than the first length.

The contact plug may include a first region in a lower portion of the contact plug and a second region on the first region. The step portion may be provided by the second region extending to be longer than the first region in the second direction.

The contact plug may be on, and in some embodiments may cover, at least portions of upper and side surfaces of the source/drain regions on the one side of the gate electrode.

Both sides of the contact plug extending in the second direction may have the step portions.

The step portions in both sides of the contact plug may narrow toward the substrate.

The step portion in one side of the contact plug may narrow toward the substrate and the step portion in the other side of the contact plug may widen toward the substrate.

One side of the contact plug may have a plurality of step portions.

Two or more of the active fins may be disposed adjacent to each other in the second direction, and the gate electrode may intersect the two or more of the active fins. The semiconductor device further comprises a source/drain region disposed on each of the active fins on both sides of the gate electrode.

The source/drain regions may have a structure in which the source/drain regions are connected to each other on two or more of the active fins.

The active fin may include recessed regions on both sides of the gate electrode, and the source/drain regions may be disposed in the recessed regions.

The source/drain regions may include a silicon germanium (SiGe) epitaxial layer.

The semiconductor device may further include a wiring line connected to the contact plug on the contact plug, and the wiring line may be disposed on the side of the contact plug having the step portion.

Two of the contact plugs may be disposed on both sides of the gate electrode, respectively, and may be connected to two of the wiring lines different from each other, respectively. The step portions on the respective contact plugs may be located on different sides of the contact plugs.

According to another aspect of the present inventive concepts, a semiconductor device may include a substrate having an active region, a gate electrode on the active region to cross the active region, source/drain regions on the active region and elevated from the substrate, and a contact plug on, and in some embodiments covering, portions of an upper surface and a side of the source/drain regions, and having at least one side which has a step portion having a step shape above the source/drain regions.

The step portion may be located on the side of the contact plug in a direction of the gate electrode extending and intersecting the active region.

The semiconductor device may further include a wiring line disposed on the side of the contact plug having the step portions, connected to the contact plug, and extending in a direction parallel to the active region.

According to another aspect of the present inventive concepts, a semiconductor device may include a substrate with an active region, a gate electrode on the active region to cross the active region, source/drain regions on the active region and elevated from the substrate, and a contact plug on the source/drain regions and having an asymmetrical shape in a direction of the gate electrode extending and intersecting the active region.

According to another aspect of the present inventive concepts, a method of manufacturing a semiconductor device may include defining an active fin extending in a first direction on a substrate, forming a gate electrode extending in a second direction that is different from the first direction and intersecting the active fin, forming a source/drain region disposed on the active fin on both sides of the gate electrode, and forming a contact plug disposed on one of the source/drain regions and having at least one side extending in the second direction which has a step portion having a step shape.

The forming of the contact plug may include forming an interlayer insulating layer on, and in some embodiments covering, the source/drain regions, a first patterning operation removing a portion of the interlayer insulating layer using a first mask layer having a first open region on the source/drain regions, a second patterning operation removing a portion of the interlayer insulating layer using a second mask layer having a second open region on the source/drain regions that is different in size than the first open region, and providing a conductive material in, and in some embodiments filling, a region removed of the interlayer insulating layer.

The first and second open regions may be at least partially overlapped.

The second open region may include the first open region, and may be formed to be expanded further than the first open region on at least one side. The step portion may be formed in a region where the first and second open regions do not overlap.

The forming of the contact plug may include forming a first interlayer insulating layer on, and in some embodiments covering, the source/drain regions, a first patterning operation removing a portion of the first interlayer insulating layer using a first mask layer on the source/drain regions, forming a first region of the contact plug in, and in some embodiments by filling, a region removed of the first interlayer insulating layer with a conductive material, forming a second interlayer insulating layer on, and in some embodiments covering, the first region, a second patterning operation removing a portion of the second interlayer insulating layer using a second mask layer on the source/drain regions, and forming a second region of the contact plug in, and in some embodiments by filling, a region removed of the second interlayer insulating layer with a conductive material.

BRIEF DESCRIPTION OF DRAWINGS

The above and other aspects, features and advantages of the present inventive concepts will be more clearly understood from the following detailed description taken in conjunction with the accompanying drawings, in which.

DETAILED DESCRIPTION

Figure 1:
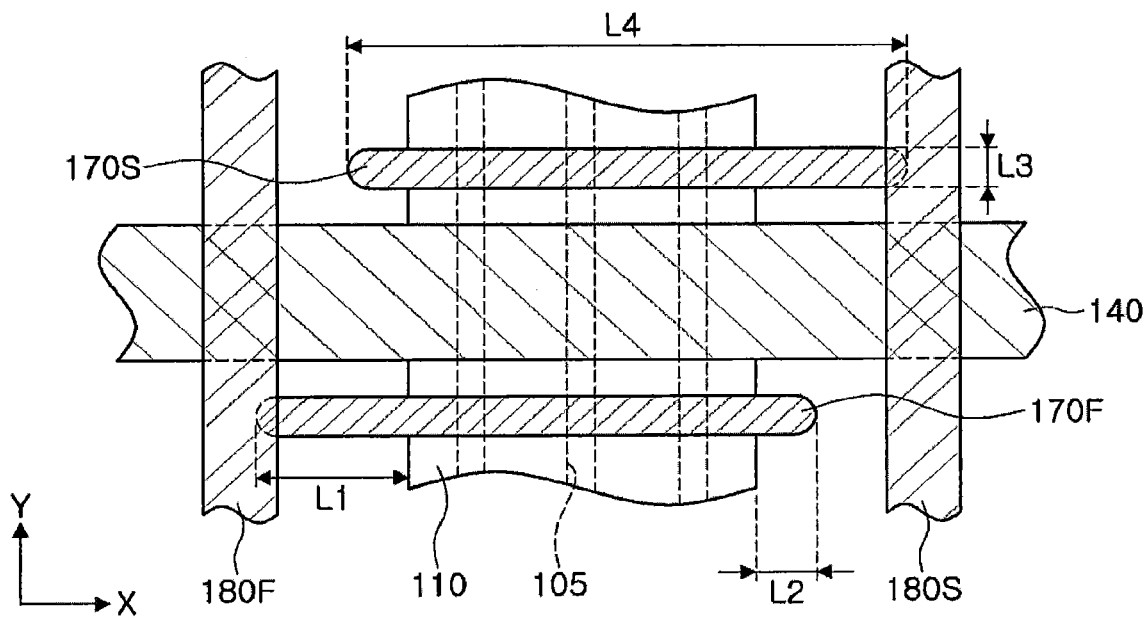
FIGS. 1 and 2 are a plan view and a perspective view illustrating a semiconductor device according to example embodiments of the present inventive concepts.

Hereinafter, example embodiments of the present disclosure will be described in detail with reference to the accompanying drawings. The disclosure may, however, be exemplified in many different forms and should not be construed as being limited to the specific example embodiments set forth herein. Rather, these example embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" to another element, it can be directly connected to the other element or intervening elements may be present. In contrast, when an element is referred to as being "directly connected" to another element, there are no intervening elements present. Other words used to describe the relationship between elements should be interpreted in a like fashion (e.g., "between" versus "directly between", "adjacent" versus "directly adjacent", etc.).

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes", "including", "have" and/or "having (and variants thereof) when used herein, specify the presence of stated elements or steps but do not preclude the presence or addition of one or more other elements or steps.

Figure 2:
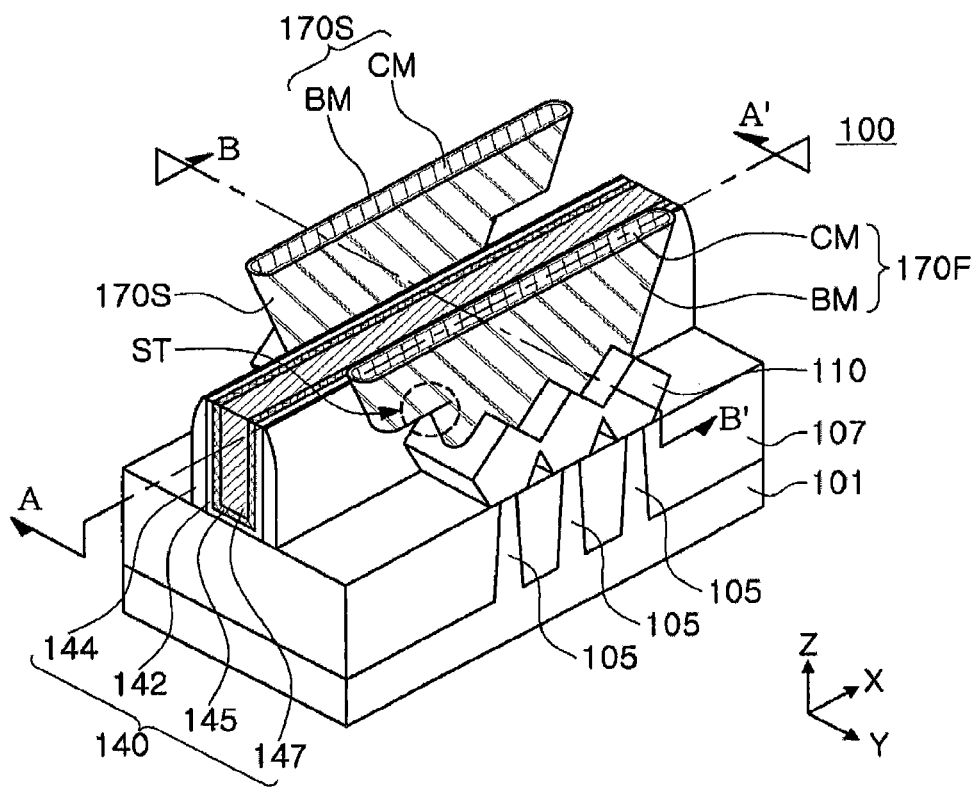
Figure 3A:
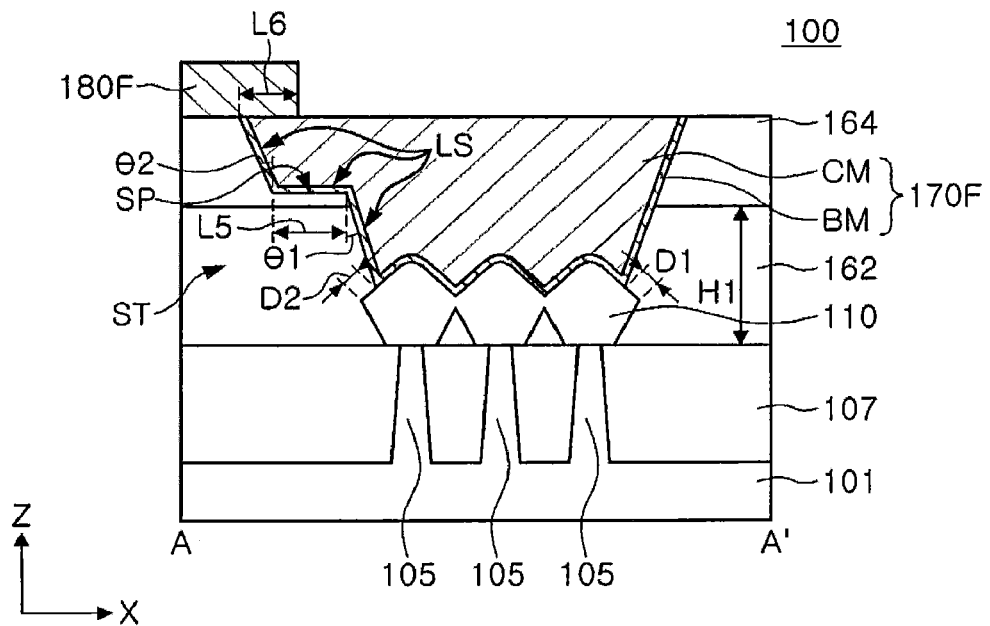
FIGS. 3A and 3B are cross-sectional views taken along line A-A' and line B-B' of the semiconductor device of FIG. 2.
Figure 3B:
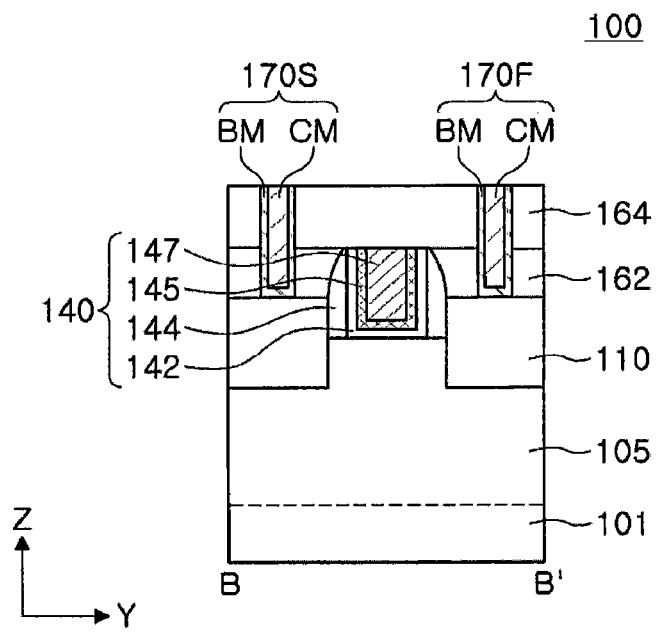

FIGS. 1 and 2 are a plan view and a perspective view, respectively, illustrating a semiconductor device according to example embodiments of the present inventive concepts. FIGS. 3A and 3B are cross-sectional views taken along line A-A' and line B-B' of a semiconductor device of FIG. 2. For convenience of description, FIG. 1 illustrates only the major configuring elements, and FIG. 2 is illustrated omitting first and second interlayer insulating layers 162 and 164.

Referring to FIGS. 1 to 3B, a semiconductor device 100 may include a substrate 101, active fins 105, source/drain regions 110, a gate structure 140, contact plugs 170F and 170S, and wiring lines 180F and 180S. The semiconductor device 100 may further include isolation layers 107 and first and second interlayer insulating layers 162 and 164.

The semiconductor device 100 in the example embodiment of the present inventive concepts may be provided as a FinFET with the active fins 105 having a fin structure.

The substrate 101 may have an upper surface extending in x and y directions. The substrate 101 may include a semiconductor material such as a group IV semiconductor material, a group III-V compound semiconductor material and/or a group II-VI semiconductor material. For example, a group IV semiconductor material may include silicon, germanium and/or silicon-germanium. The substrate 101 may be provided as a bulk wafer, an epitaxial layer, a Silicon-on-Insulator (SOI) layer, a Semiconductor-on-Insulator (SeOI) layer, or the like.

The isolation layers 107 may define the active fins 105 in the substrate 101. The isolation layers 107 may contain an insulating material. The isolation layers 107 may be, for example, formed by a shallow trench element isolation (STI) process. The isolation layers 107 may be, for example, oxides, nitrides, or combinations thereof.

The active fins 105 may be defined by the isolation layers 107 in the substrate 101, and may be disposed to be extended in a first direction, for example, in the y-direction. The active fins 105 may have an active fin structure protruding from the substrate 101. The active fins 105 may be formed by a portion of the substrate 101 and may include an epitaxial layer grown from the substrate 101. However, on both sides of the gate structure 140, the active fins 105 on the substrate 101 may be partially removed and the source/drain regions 110 may be disposed.

The source/drain regions 110 may be disposed on the active fins 105 on both sides of the gate structure 140. The source/drain regions 110 may be provided as source regions or drain regions of the semiconductor device 100. The source/drain regions 110 may be in an elevated source/drain form in which the upper surface thereof is located higher than the lower surface of the gate structure 140. In the example embodiment of the present inventive concepts, the source/drain regions 110 are illustrated in a pentagonal shape, but the source/drain regions 110 may have various shapes such as any one of a polygonal, circular, or rectangular shape. Further, in the example embodiment of the present inventive concepts, the source/drain regions 110 are illustrated as having a structure of being connected to each other or merged together on the three active fins 105, but are not limited thereto. The source/drain regions 110 may include, for example, silicon and/or silicon germanium (SiGe).

The gate structure 140 may be disposed so as to intersect the active fins 105 on the upper portion of the active fins 105, and may include a gate insulating layer 142, first and second gate electrodes 145 and 147, and a spacer 144.

The gate insulating layer 142 may be disposed between the active fins 105 and the first and second gate electrodes 145 and 147. The gate insulating layer 142 may include an oxide, a nitride and/or a high-k dielectric (high-k) material. The high-k material may indicate a dielectric material having a higher dielectric constant than that of silicon dioxide ($SiO_2$). The high-k material may be, for example, any one or more of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide (LaAlxOy), hafnium lanthanum oxides ($LaHf_xO_y$), hafnium aluminum oxide ($HfAl_xO_y$), or praseodymium oxide ($Pr_2O_3$). In another example embodiment of the present inventive concepts, the gate insulating layer 142 may be formed only on a lower portion of the first and second gate electrodes 145 and 147.

The first and second gate electrodes 145 and 147 may be sequentially disposed on the gate insulating layer 142. When the semiconductor device 100 is a transistor, a channel region may be formed in the active fins 105 intersecting the first and second gate electrodes 145 and 147. The first and second gate electrodes 145 and 147 may be formed of different materials from each other. The first gate electrode 145 may include, for example, a metal nitride such as titanium nitride (TiN), tantalum nitride (TaN) and/or tungsten nitride (WN). The second gate electrode 147 may include, for example, a metal material such as aluminum (Al), tungsten (W), molybdenum (Mo) and/or the like, and/or a semiconductor material such as doped polysilicon. The first gate electrode 145 may serve as a diffusion barrier layer for the second gate electrode 147, but is not limited thereto. In another example embodiment of the present inventive concepts, the gate electrode may be formed of a single layer.

The spacer 144 may be disposed on the gate insulating layer 142 on both sides of the first and second gate electrodes 145 and 147. The spacer 144 may isolate the source/drain regions 110 from the first and second gate electrodes 145 and 147. The spacer 144 may be formed using an oxide, a nitride, or an oxynitride, and may also be configured of a multilayer film.

The contact plugs 170F and 170S may be disposed on the source/drain regions 110, and may electrically connect the source/drain regions 110 and the wiring lines 180F and 180S. The contact plugs 170F and 170S may penetrate the first and second interlayer insulating layers 162 and 164, but are not limited thereto.

Referring to FIG. 1, one ends of the contact plugs 170F and 170S may be extended outwardly by a first length L1 from one ends of the source/drain regions 110, respectively. The other ends of the contact plugs 170F and 170S may be extended by a second length L2, which is less than the first length L1, from the other ends of the source/drain region 110, respectively. According to example embodiments of the present inventive concepts, the first and second lengths L1 and L2 may be changed in various ways. However, the first length L1 may be determined so that the contact plugs 170F and 170S may be connected to the wiring lines 180F and 180S located on one sides of the source/drain regions 110, respectively.

The contact plugs 170F and 170S may have elongated shapes. For example, the contact plugs 170F and 170S may have a shape extending in an extended direction of the gate structure 140, for example, in an x-direction, and may have a rectangular, an oval shape and/or the like. A third length L3, a length in a y direction, may be less than a fourth length L4, a length in the x-direction; for example, the fourth length L4 may be more than three times the third length L3.

Referring to FIGS. 2 and 3A, both sides of the contact plugs 170F and/or 170S in the x-direction may have an asymmetric shape on the upper portion of the source/drain regions 110. For example, the contact plug may have a vertical or an inclined side on the source/drain regions 110, and the other side thereof may have a step portion ST having a step shape. As used herein, a "step portion" may refer to an area of a drastically differing width between a top portion and a bottom portion of the contact plugs extending in a single direction with different lengths. The step portion ST may be located outwardly of the source/drain regions 110. The contact plugs 170F and 170S may be step-shaped in reverse toward the substrate 101 with a narrowing width toward the substrate 101 by the step portion ST of the example embodiment of the present inventive concepts. However, in the present specification, unless specified otherwise, the term "step-shaped" may be used to refer to all of a step shape and a step shape in reverse toward the substrate 101. The step portions ST formed in the sides of the contact plugs 170F and 170S may be located in the side surfaces thereof provided in different directions with respect to each other. Thus, the contact plugs 170F and 170S may be stably coupled respectively to the wiring lines 180F and 180S. The contact plugs 170F and 170S may also be regarded as having at least one side that comprises a plurality of line segments LS, when viewed in cross-section.

The contact plugs 170F and 170S may include a first region on the source/drain regions 110, and a second region having a width wider than the first region on the first region. At an interface of the first and second regions, a step surface SP in which the second region is extended to be longer than the first region by a fifth length L5 may be formed. The step surface SP may be located within the second interlayer insulating layer 164, whereby a parasitic capacitance between the contact plugs 170F and 170S and the first and the second gate electrodes 145 and 147 may be significantly lessened. However, the location of the step surface SP is not limited thereto, and in an example embodiment of the present inventive concepts, the step surface SP may also be located within the first interlayer insulating layer 162.

On sides of the contact plugs 170F and 170S having step portions (ST), the first region may have a side having a gradient of a first angle θ1 with respect to a direction perpendicular to the substrate 101, and the second region may have a side having a gradient of a second angle θ2. The first and second angles θ1 and θ2 may be the same as or different from each other. The step portion ST may refer to a region including the step surface SP and upper and lower portions of the step surface SP perpendicular or inclined to the step surface SP. The step surface SP may be located outwardly of the source/drain regions 110 in the x-direction and may be parallel to the upper surface of the substrate 101, or may have a gradient. The fifth length L5 may be determined in consideration of the distance between the source/drain regions 110 and the wiring lines 180F and 180S, and the gradient of the sides of the contact plugs 170F and 170S.

The contact plugs 170F and 170S may be on, and in some embodiments may cover, a portion of the upper surface of the source/drain regions 110. For example, the contact plugs 170F and 170S may cover the entire upper surface of the source/drain regions 110 on a cross section in an x-z direction as in FIG. 3A. Further, the contact plugs 170F and 170S may cover at least portions of the upper and side surfaces of the source/drain regions 110. In the example embodiment of the present inventive concepts, the contact plugs 170F and 170S may cover at least two surfaces of the respective pentagonal areas forming the source/drain regions 110. The contact plugs 170F and 170S may be spaced apart by first and second distances D1 and D2 respectively from both ends of the source/drain regions 110, but are not limited thereto. The first and second distances D1 and D2 may be the same as or different from each other, or may be zero. In another example embodiment of the present inventive concepts, the contact plugs 170F and 170S may cover the end portions of the source/drain regions 110 and may be extended to the lower portion thereof.

The contact plugs 170F and 170S may include a barrier layer BM and a conductive layer CM. The barrier layer BM may function as a diffusion barrier layer on a metal material forming the conductive layer CM. The barrier layer BM may be formed along the upper portion of the source/drain regions 110, the side walls of the contact plugs 170F and 170S, and the step surface SP. The barrier layer BM may include, for example, at least one metal nitride among titanium nitride (TiN), tantalum nitride (TaN) and/or tungsten nitride film (WN). The conductive layer CM may include a conductive material such as aluminum (Al), copper (Cu), tungsten (W) and/or molybdenum (Mo).

The first and second interlayer insulating layers 162 and 164 may be disposed on, and in some embodiments to cover, the substrate 101, the source/drain regions 110, and the gate structure 140. A height H1 of the first interlayer insulating layer 162 may be substantially the same as a height of the gate structure 140. However, as the first and second interlayer insulating layers 162 and 164 may be layers formed in the different process steps, relative heights and relative locations thereof with respect to the step surface SP are not limited to those illustrated in the drawings. In another example embodiment of the present inventive concepts, the first and second interlayer insulating layers 162 and 164 may be formed of a single layer. The first and second interlayer insulating layers 162 and 164 may be formed of an insulating material, and may include at least one of an oxide film, a nitride film, and/or an oxynitride film. For example, the first interlayer insulating layer 162 may be provided as a tonen silazene (TOZ) film, and the second interlayer insulating layer 164 may be a tetraethyl ortho silicate (TEOS) film.

The wiring lines 180F and 180S may be disposed to be connected to the contact plugs 170F and 170S. Referring to FIGS. 1 and 3A, the wiring lines 180F and 180S may be located on upper portions of one side of the contact plugs 170F and 170S, and may be contacted therewith by a sixth length L6. The sixth length L6 may be determined in consideration of the third length L3, which is the width of the contact plugs 170F and 170S, the resistance of the contact plugs 170F and 170S, and the like. The wiring lines 180F and 180S may include a conductive material such as aluminum (Al), copper (Cu) and/or tungsten (W), and the like.

FIGS. 4 to 7 are cross-sectional views illustrating a semiconductor device according to example embodiments of the present inventive concepts. FIGS. 4 to 7 illustrate cross sections corresponding to FIG. 3A.

Figure 4:
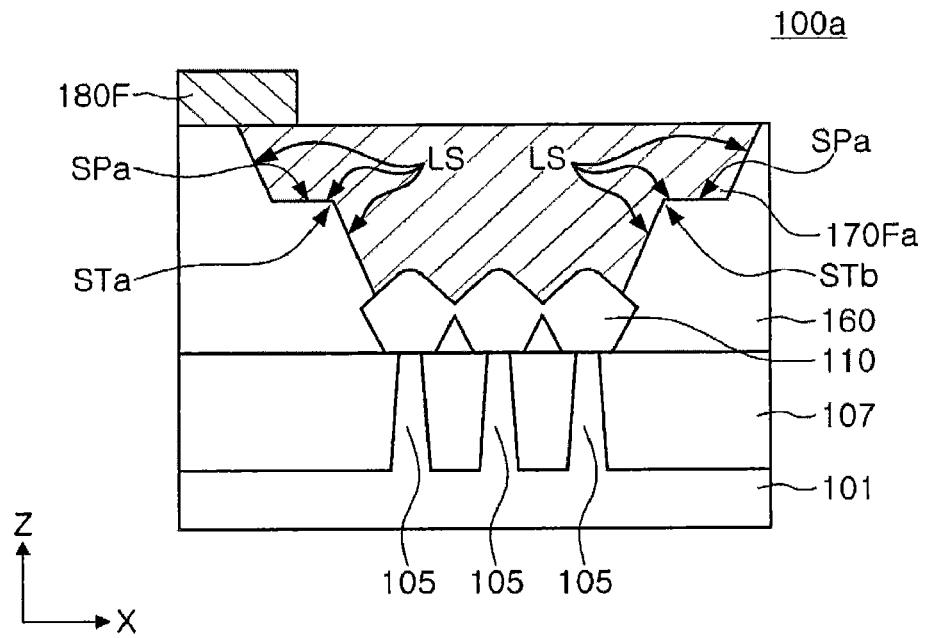
FIGS. 4 to 7 are cross-sectional views illustrating a semiconductor device according to example embodiments of the present inventive concepts.

Referring to FIG. 4, a semiconductor device 100*a* may include a substrate 101, active fins 105, source/drain regions 110, a gate structure 140, a contact plug 170Fa, and a wiring line 180F. The semiconductor device 100*a* may further include isolation layers 107, and an interlayer insulating layer 160.

The contact plug 170Fa may be disposed on the source/drain regions 110, and may electrically connect the source/drain regions 110 and the wiring line 180F. The contact plug 170Fa may penetrate the interlayer insulating layer 160. In example embodiments of the present inventive concepts below, the contact plug 170Fa is illustrated in a simplified form, but as in the example embodiments of the present inventive concepts in FIGS. 3 to 4B, the contact plug 170Fa may include a barrier layer BM, and a conductive layer CM.

In the semiconductor device 100*a* in the example embodiment of the present inventive concepts, both sides of the contact plug 170Fa of on the upper portion of the source/drain regions 110 may have step portions STa and STb having a step shape. Both sides of the contact plug 170Fa may be step-shaped in reverse toward the substrate 101, by the step portions STa and STb.

The step portions STa and STb may be located outwardly of the source/drain regions 110. The step portions STa and STb may have the same shape as each other or have different shapes. For example, in the step portions STa and STb, the length of step surfaces SPa and SPb, and the gradients of the sides of the contact plug 170Fa on the upper and lower portions of the step surfaces SPa and SPb may be the same as or different from each other. The contact plug 170Fa may also be regarded as having at least one side that comprises a plurality of line segments LS, when viewed in cross-section.

The wiring line 180F is illustrated as being connected to the contact plug 170Fa only on one side of the contact plug 170Fa, but is not limited thereto. For example, an additional wiring line 180F may be disposed on the right side of the contact plug 170Fa.

Figure 5:
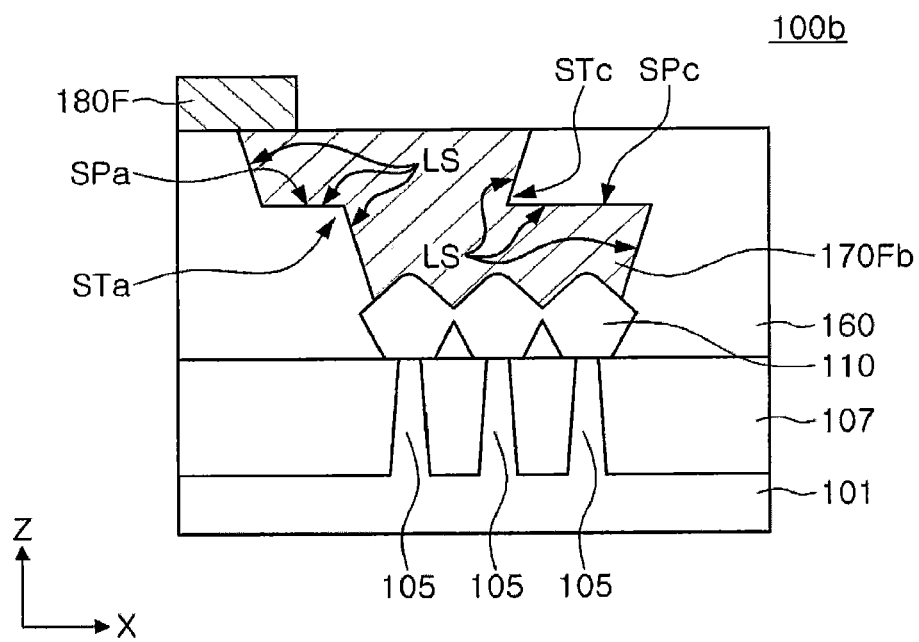

Referring to FIG. 5, a semiconductor device 100*b* may include a substrate 101, active fins 105, source/drain regions 110, a gate structure 140, a contact plug 170Fb, and a wiring line 180F. The semiconductor device 100*b* may further include isolation layers 107 and an interlayer insulating layer 160.

In the semiconductor device 100*b* in the example embodiment of the present inventive concepts, both sides of the contact plug 170Fb on the upper portion of the source/drain regions 110 may have step portions STa and STc having a step shape. Of the step portions STa and STc, the step portion STa on the left side in FIG. 5 may be formed so that a width of the contact plug 170Fb may widen toward the upper portion thereof in the z direction, and the step portion STc on the right side in FIG. 5 may be formed so that a width thereof may narrow. Thus, the left side of the contact plug 170Fb may be step-shaped in reverse toward the substrate 101, and the right side thereof may be step-shaped by the step portions STa and STc. The step portion STa on the left side of the contact plug 170Fb may be located outwardly of the source/drain regions 110, and the step portion STc on the right side may be located above the source/drain regions 110. Lengths of the step surfaces SPa and SPc may be the same or different from each other. For example, the length of the step surface SPc on the right side may be greater than the length of the step surface SPa on the left side.

In the example embodiment of the present inventive concepts, the step portions STa and STc may be formed on the left and right sides of the contact plug 170Fb as described above in a direction of expanding and a direction of decreasing the width of the contact plug 170Fb respectively, allowing for a volume and a cross-sectional area of a plane in x-z directions of the contact plug 170Fb to be reduced. Since the cross-sectional area of the plane in x-z directions of the contact plug 170Fb decreases, a parasitic capacitance between the contact plug 170Fb and the first and second gate electrodes 145 and 147 (see FIG. 2) may be reduced. The contact plug 170Fb may also be regarded as having at least one side that comprises a plurality of line segments LS, when viewed in cross-section.

The wiring line 180F may be connected to the contact plug 170Fb on the upper portion of the step portion STa on the left side.

Figure 6:
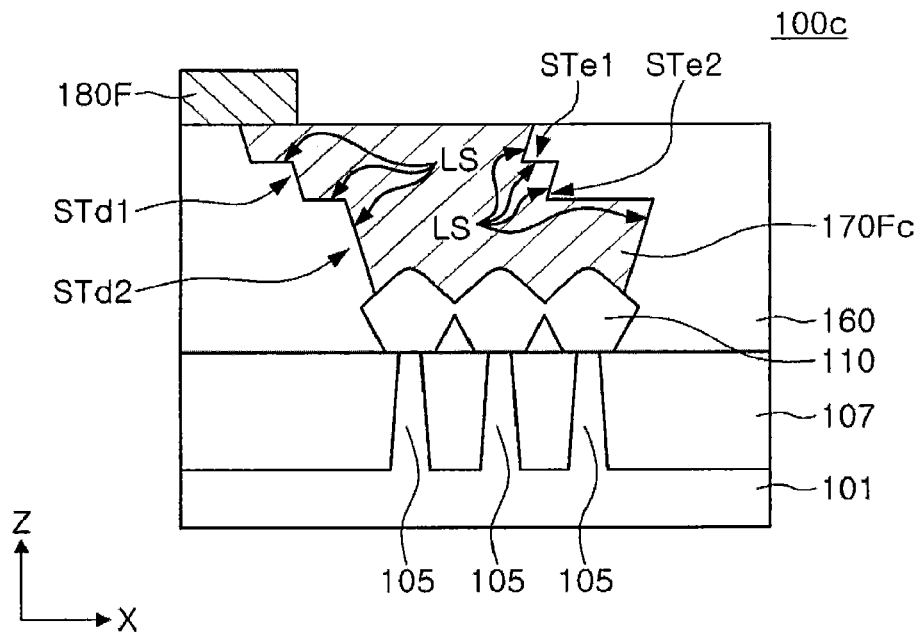

Referring to FIG. 6, a semiconductor device 100*c* may include a substrate 101, active fins 105, source/drain regions 110, a gate structure 140, a contact plug 170Fc, and a wiring line 180F. The semiconductor device 100*c* may further include isolation layers 107 and an interlayer insulating layer 160.

In the semiconductor device 100*c* in the example embodiment of the present inventive concepts, both sides of the contact plug 170Fc on the upper portion of the source/drain regions 110 may have step portions STd1, STd2, STe1, and STe2 having a step shape, respectively. A plurality of step portions STd1, STd2, STe1, and STe2 may be formed on a single side of the contact plug 170Fc. The step portions STd1 and STd2 on the left side of the contact plug 170Fc may be formed so that the width of the contact plug 170Fc may widen toward the upper portion in the z direction, and the step portions STe1 and STe2 on the right side may be formed so that the width thereof may narrow. Thus, the step portions STd1 and STd2 on the left side may be located outwardly of the source/drain regions 110, and the step portions STe1 and STe2 on the right side may be located above the source/drain regions 110. The length of the step surfaces may be the same or different from each other. The contact plug 170Fc may also be regarded as having at least one side that comprises a plurality of line segments LS, when viewed in cross-section.

The example embodiment of the present inventive concepts illustrates two step portions STd1, STd2, Ste1, and Ste2 being formed on the left side and the right side of the contact plug 170Fc, respectively, but the number of step portions is not limited thereto, and may be selected in various ways. The numbers of the step portions STd1, STd2, Ste1, and Ste2 formed on the left side and the right side of the contact plug 170Fc, respectively, may also be different from each other.

In the example embodiment of the present inventive concepts, a plurality of step portions STd1, STd2, Ste1, and Ste2 may be formed on the left and right sides of the contact plug 170Fc, respectively, as described above, allowing a more detailed shape of the contact plug 170Fc.

The wiring line 180F may be connected to the contact plug 170Fc on the upper portion of the step portions STd1 and STd2 on the left side of the contact plug 170Fc.

Figure 7:
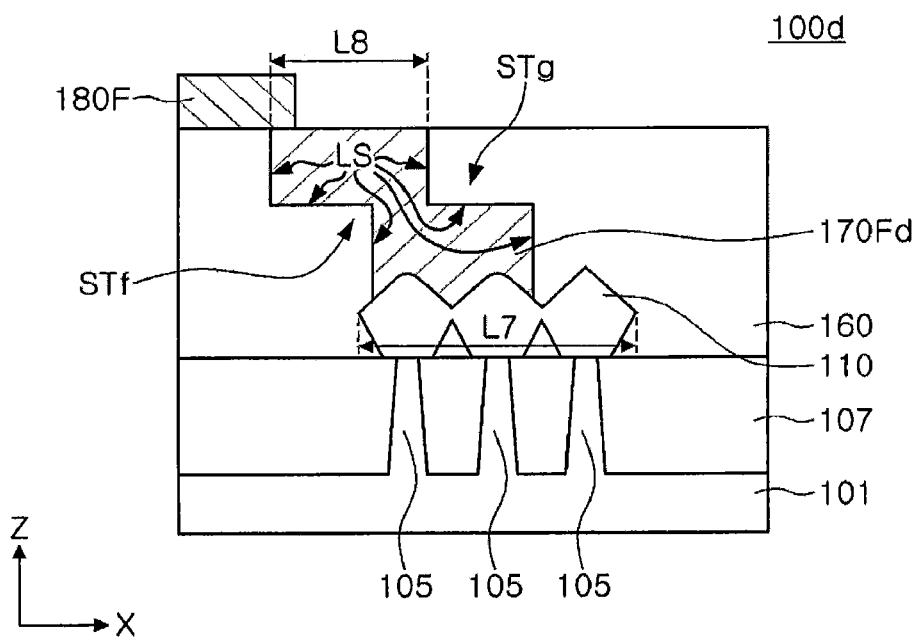

Referring to FIG. 7, a semiconductor device 100d may include a substrate 101, active fins 105, source/drain regions 110, a gate structure 140, a contact plug 170Fd, and a wiring line 180F. The semiconductor device 100d may further include isolation layers 107 and an interlayer insulating layer 160.

In the semiconductor device 100d of the example embodiment of the present inventive concepts, the maximum length L8 of the contact plug 170Fd in an x direction may be shorter than the maximum length L7 of the source/drain regions 110. One ends on the left side of the contact plug 170Fd may be extended outwardly from one end of the source/drain regions 110, and other ends on the right side of the contact plug 170Fd may be located above the source drain regions 110. Thus, the contact plug 170Fd be on, and in some embodiments may cover, only a portion of the upper surface of the source/drain regions 110. The contact plug 170Fd may also be regarded as having at least one side that comprises a plurality of line segments LS, when viewed in cross-section.

In the example embodiment of the present inventive concepts, the contact plug 170Fd may be formed on, and in some embodiments to cover, only a portion of the upper surface of the source/drain regions 110 as described above, allowing for a volume and a cross-sectional area in the plane x to z of the contact plug 170Fd to be reduced. Thus, a parasitic capacitance between the contact plug 170Fd and the first and second gate electrodes 144 and 147 (see FIG. 2) may be reduced. However, since resistance may increase according to the reduction of the volume of the contact plug 170Fd, the size of the contact plug 170Fd may be determined in consideration of the material of the contact plug 170Fd and the desired contact resistance.

The contact plug 170Fd may have step-shaped step portions STf and STg on both sides on the upper portion of the source/drain regions 110. Of the step portions STf and STg, the step portion STf on the left side may be formed so that the width of the contact plug 170Fd may widen toward the upper portion in the z direction, and the step portion STg on the right side may be formed so that the width may narrow. The length of the step surfaces may be the same or different from each other. In addition, the side of the contact plug 170Fd may be perpendicular to the substrate 101, forming step portions STf and STg in a perpendicular form. However, the example embodiment of the present inventive concepts is not limited thereto, and the side of the contact plug 170Fd may be formed to have a desired gradient.

The wiring line 180F may be connected to the contact plug 170Fd on the upper portion of the step portion STf on the left side.

Figure 8:
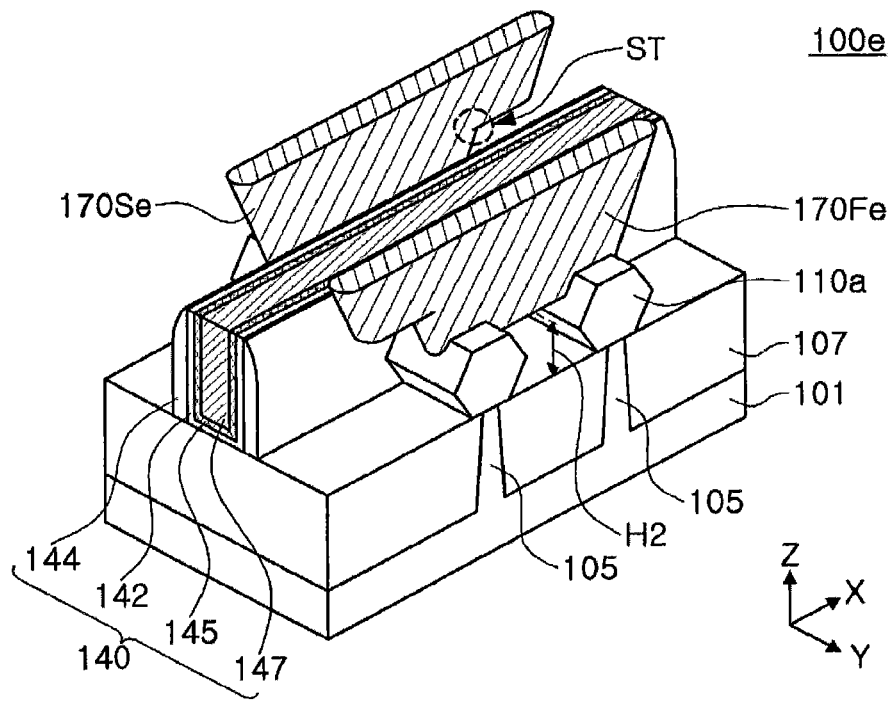
FIGS. 8 and 9 are perspective views illustrating a semiconductor device according to example embodiments of the present inventive concepts.
Figure 9:
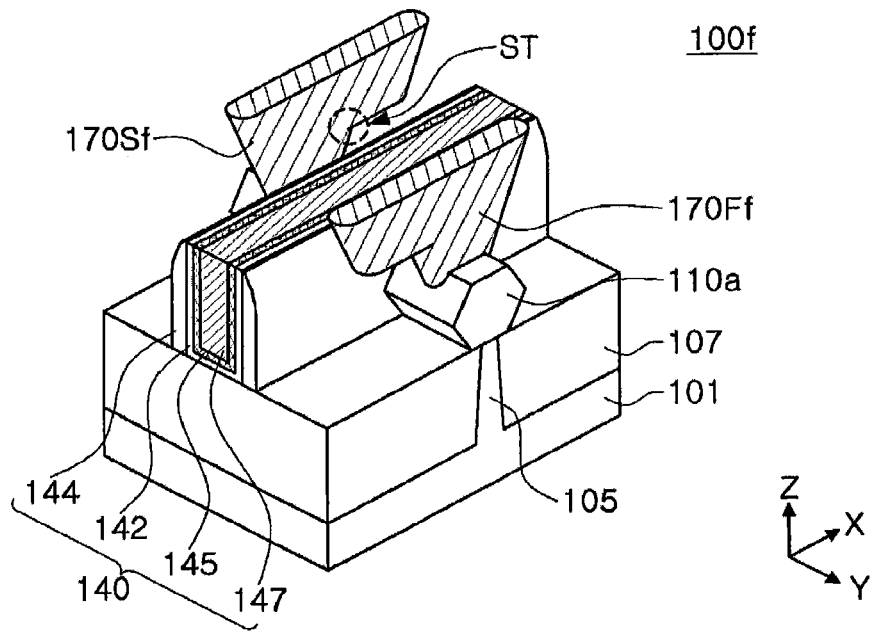

FIGS. 8 and 9 are perspective views illustrating a semiconductor device according to example embodiments of the present inventive concepts.

Referring to FIG. 8, a semiconductor device 100e may include a substrate 101, active fins 105, source/drain regions 110a, a gate structure 140, and contact plugs 170Fe and 170Se. The semiconductor device 100d may further include isolation layers 107.

In the example embodiment of the present inventive concepts, the source/drain regions 110a of the semiconductor device 100e may have a hexagonal shape. The shape of the source/drain regions 110a may be determined by a processing time and thickness or the like in a forming process of the source/drain regions 110a. For example, in a case in which the source/drain regions 110a are formed of an epitaxial layer, the source/drain regions 110a may have a hexagonal shape by a crystal orientation and the like of the epitaxy as in the example embodiment of the present inventive concepts, or may have a pentagonal shape as illustrated in FIG. 2.

The source/drain regions 110a may be disposed to be spaced apart from each other on the two adjacent active fins 105. The number of active fins 105 intersecting with a single gate structure 140 may be modified in various ways according to the example embodiment of the present inventive concepts.

The contact plugs 170Fe and 170Se may be disposed on the source/drain regions 110a, and may electrically connect the source/drain regions 110a and the wiring lines 180F and 180S (see FIG. 1). The two sides of the contact plugs 170Fe and 170Se in the x direction may have an asymmetric shape on an upper portion of the source/drain region 110a. For example, one side may have a perpendicular or an inclined side with respect to the source/drain regions 110a, and the other side may have a step-shaped step portion ST.

The contact plugs 170Fe and 170Se may be on, and in some embodiments may cover, at least portions of upper surfaces and sides of the source/drain regions 110a. In the example embodiment of the present inventive concepts, the contact plugs 170Fe and 170Se may be on, and in some embodiments may cover, portions of the upper surface and the inclined sides of both sides of the upper surfaces in the respective hexagonal area of the source/drain regions 110a. The lower surfaces of the contact plugs 170Fe and 170Se may be located at a second height H2 from the upper surface of the substrate 101, between the upper portions of the source/drain regions 110a adjacent to each other in the x direction. The second height H2 may be modified in various ways within a range of not coming into contact with the upper surface of the substrate 101.

Referring to FIG. 9, a semiconductor device 100f may include a substrate 101, active fins 105, a source/drain region 110a, a gate structure 140, and contact plugs 170Ff and 170Sf. The semiconductor device 100f may further include isolation layers 107.

The source/drain region 110a may have a hexagonal shape as in the example embodiment of the present inventive concepts of FIG. 8. In the example embodiment of the present inventive concepts, the semiconductor device 100f may include only one active fin 105, and the source/drain region 110a may be disposed on the active fin 105. The contact plugs 170Ff and 170Sf may be on, and in some embodiments may cover, a portion of the upper surface and the inclined sides of both sides of the upper surfaces of the source/drain region 110a.

FIGS. 10 to 22B are views illustrating a process sequence to illustrate a method of manufacturing a semiconductor device according to example embodiments of the present inventive concepts.

Figure 10:
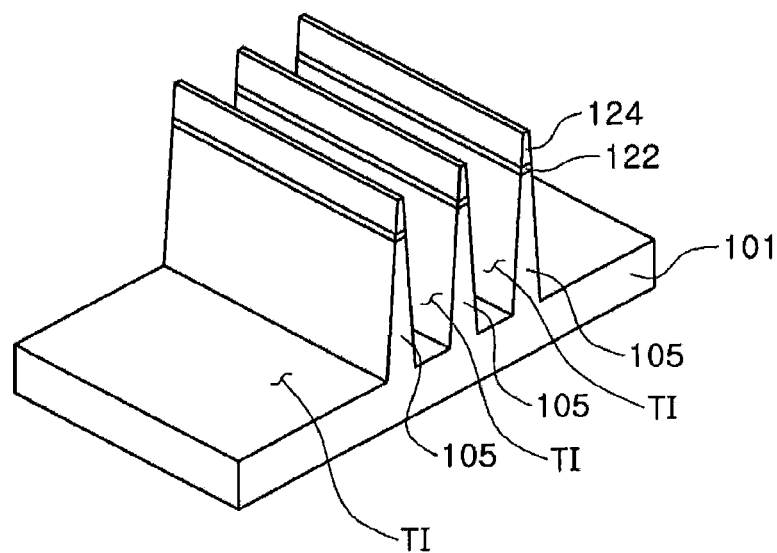
FIGS. 10 to 22B are views illustrating a process sequence to illustrate a method of manufacturing a semiconductor device according to example embodiments of the present inventive concepts.

Referring to FIG. 10, trenches TI defining active fins 105 may be formed by patterning a substrate 101.

First, a pad oxide pattern 122 and a mask pattern 124 may be formed on the substrate 101. The pad oxide pattern 122 may be a layer protecting the upper surface of the active fins 105, and may be omitted according to an example embodiment of the present inventive concepts. The mask pattern 124 may be a mask layer patterning the substrate 101, and may include silicon nitride and/or a carbon-containing material, and the like. The mask pattern 124 may be formed of a multi-layer structure.

The trenches TI may be formed by anisotropic etching of the substrate 100 using the pad oxide pattern 122 and the mask pattern 124. Since the trenches TI may have high aspect ratios, widths thereof may gradually narrow toward the lower portion; thereby, the active fins 105 may have a shape of narrowing towards the upper portion thereof.

Figure 11:
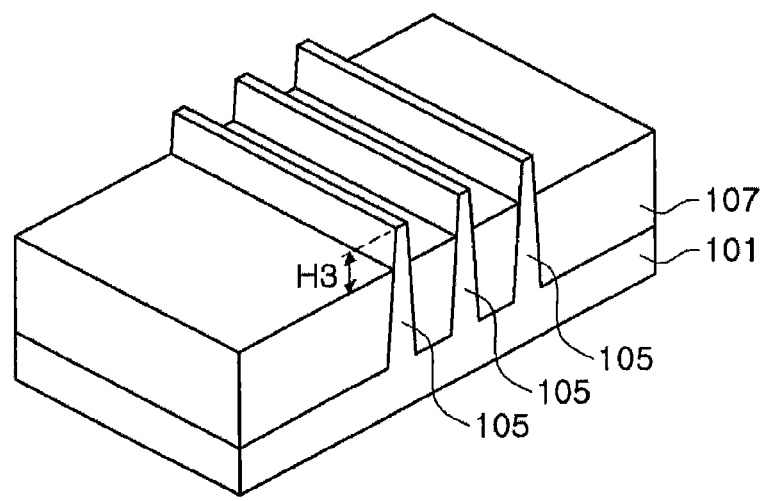

Referring to FIG. 11, an isolation layer 107 in, and in some embodiments filling, the trenches TI may be formed.

First, processes of filling the trenches TI with an insulating material and planarization may be performed. At least portions of the pad oxide pattern 122 and the mask pattern 124 may be removed during the planarization process. In another example embodiment of the present inventive concepts, the trenches TI may be filled after first forming a relatively thin liner layer within the trenches TI.

Next, by removing a portion of the insulating material for filling the trenches TI, a process of projecting the active fins 105 from the substrate 101 may be performed. This process may be performed, for example, as a wet etching process using at least a portion of the pad oxide pattern as an etching mask. As a result, the active fins 105 may be projected by a height H3 toward the upper portion, and the projecting height H3 may be modified in various ways. During the etching process, the pad oxide pattern 122 may also be removed.

Figure 12:
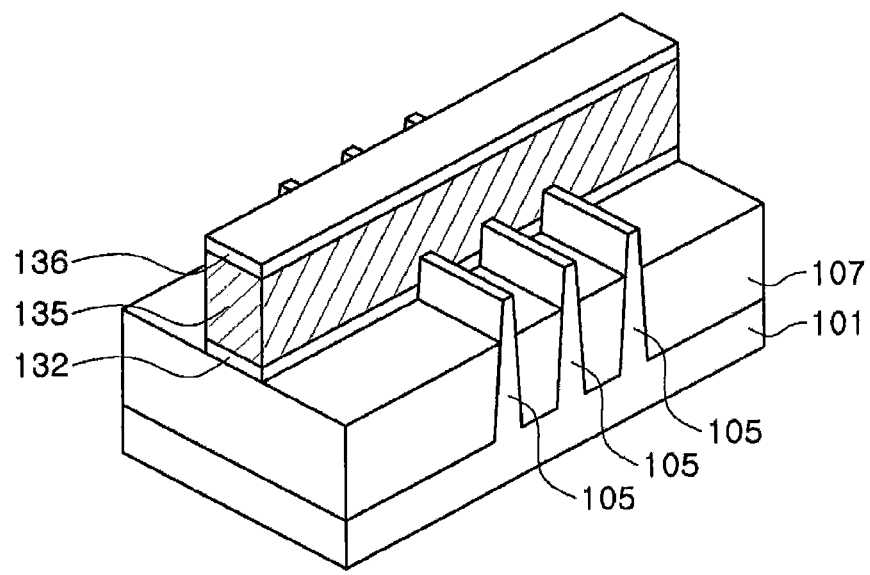

Referring to FIG. 12, a dummy gate insulating layer 132 and a dummy gate electrode 135 extended by intersecting active fins 105 may be formed.

The dummy gate insulating layer 132 and the dummy gate electrode 135 may be formed, for example, by performing an etching process using a mask pattern layer 136.

The dummy gate insulating layer 132 and the dummy gate electrode 135 may be formed on a region where the gate insulating layer 142 and the first and second gate electrodes 145 and 147 (see FIG. 2) are to be formed, and may be removed during a subsequent process. For example, the dummy gate insulating layer 132 may include silicon oxide, and the dummy gate electrode 135 may include polysilicon.

Figure 13:
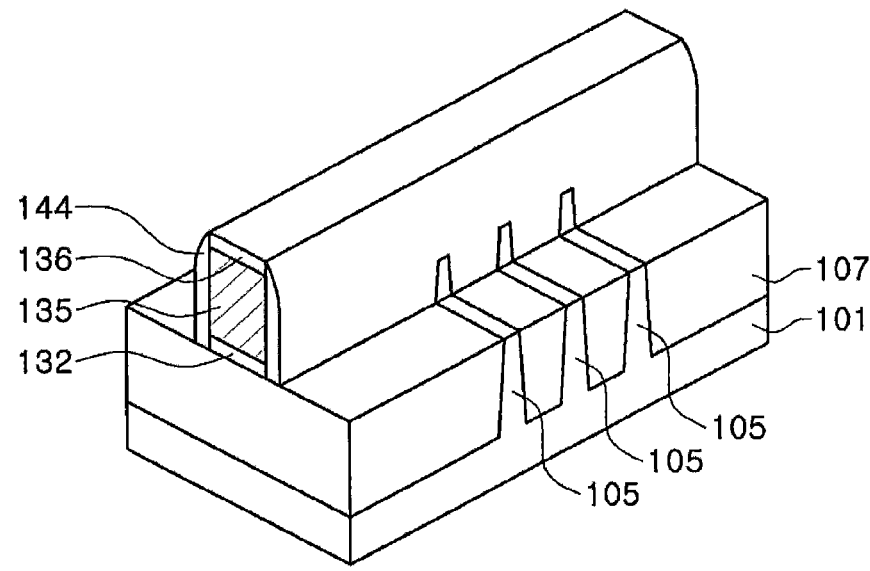

Referring to FIG. 13, a spacer 144 may be formed on both sides of a dummy gate insulating layer 132, a dummy gate electrode 135, and a mask pattern layer 136. Next, active fins 105 on both sides of the spacer 144 may be selectively removed.

The spacer 144 may be formed by forming a film having a uniform thickness on the upper portion of the dummy gate insulating layer 132, the dummy gate electrode 135, and the mask pattern layer 136, and by anisotropically etching of the film.

Recesses may be formed by removing the active fins 105 from both sides of the spacer 144. The recesses may be formed by etching portions of the active fins 105 by forming a separate masking layer or using the mask pattern layer 136 and the spacer 144 as a mask. The recess may be formed, for example, by sequentially applying a dry etching process and a wet etching process thereto. Selectively, after the formation of the recesses, a process of curing the surfaces of the recessed active fins 105 may be performed by a separate process. In the example embodiment of the present inventive concepts, the upper surfaces of the recessed active fins 105 are illustrated as being at the same level as the upper surface of the isolation layer 107, but are not limited thereto. In another example embodiment of the present inventive concepts, the upper surface of the recessed active fins 105 may be higher or lower than the upper surface of the isolation layer 107.

Before or after the formation of the recesses, a process of implanting impurities in the active fins 105 on both sides of the dummy gate electrode 135 may be performed. The process of implanting impurities may be performed using the mask pattern layer 136 and the spacer 144 as a mask.

Figure 14:
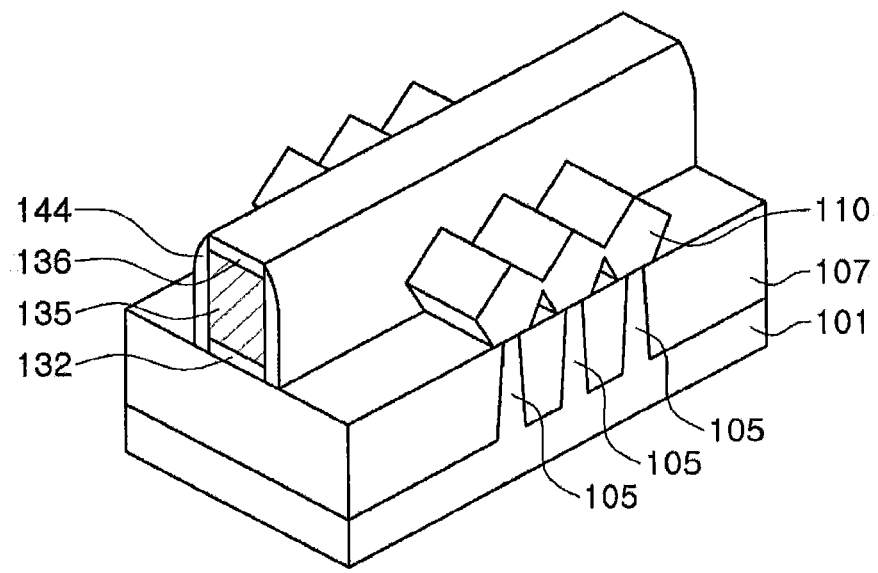

Referring to FIG. 14, a source/drain region 110 may be formed on recessed active fins 105 on both sides of the spacer 144.

The source/drain region 110 may be formed, for example, using a selective epitaxial growth (SEG) process. The source/drain region 110 may have a pentagonal or a hexagonal shape as illustrated by growing along a crystallographically stable surface in a growth process. However, the size and shape of the source/drain region 110 are not limited to the illustration.

The source/drain region 110 may be, for example, a silicon germanium (SiGe) layer. In a case in which SiGe is grown on active fins 105 formed of silicon (Si), compressive stress may be generated in a channel region of the semiconductor device. Such a compressive stress may be increased as a concentration of germanium (Ge) increases. In some example embodiments of the present inventive concepts, the concentration of Ge within the source/drain region 110 may be formed differently according to the height.

The source/drain region 110 may contain impurities. The impurities may be contained by in-situ implantation of ions during growth of the source/drain region 110 and/or by a separate implantation of ions after growth. The grown source/drain region 110 may be provided as a source region or a drain region of the semiconductor device.

Figure 15:
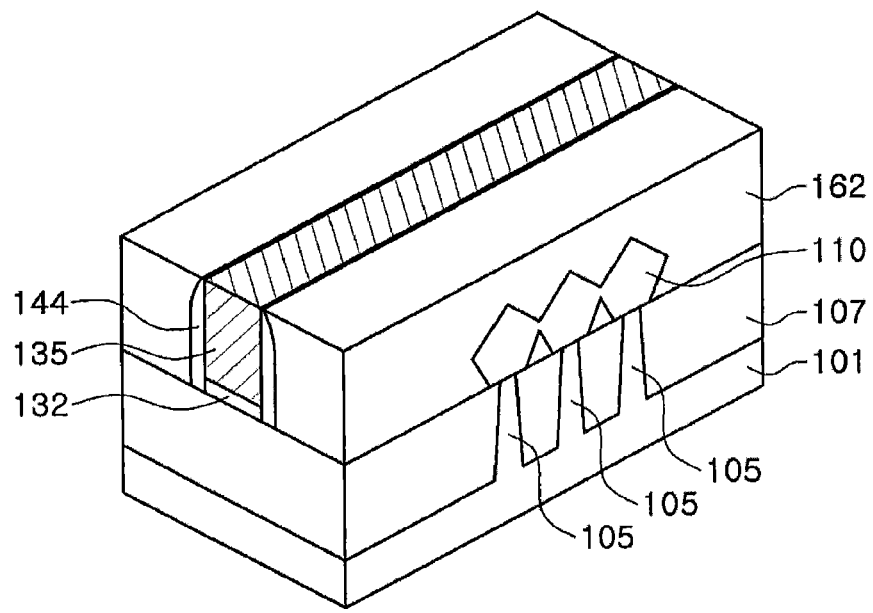

Referring to FIG. 15, a first interlayer insulating layer 162 may be formed on a source/drain region 110.

The first interlayer insulating layer 162 may be formed by forming a layer on, and in some embodiments covering, a mask pattern layer 136, a spacer 144, and a source/drain region 110 with an insulating material, and by allowing the upper surface of a dummy gate electrode 135 to be exposed through a planarization process. Thus, the mask pattern layer 136 may be removed during this process.

The first interlayer insulating layer 162 may include, for example, at least one oxide, nitride and/or oxynitride.

Figure 16:
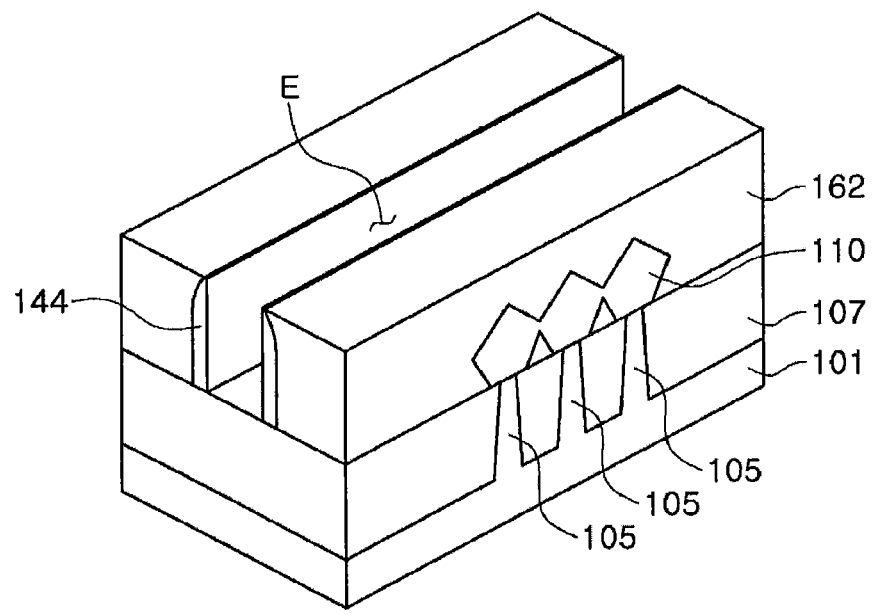

Referring to FIG. 16, a dummy gate insulating layer 132 and a dummy gate electrode 135 may be removed.

The dummy gate insulating layer 132 and the dummy gate electrode 135 may be selectively removed with respect to an isolation layer 107 and active fins 105 of the lower portion, and an opening E exposing the isolation layer 107 and the active fins 105 may be formed.

The removal process of the dummy gate insulating layer 132 and the dummy gate electrode 135 may be through at least one of a dry etching process and/or a wet etching process.

Figure 17:
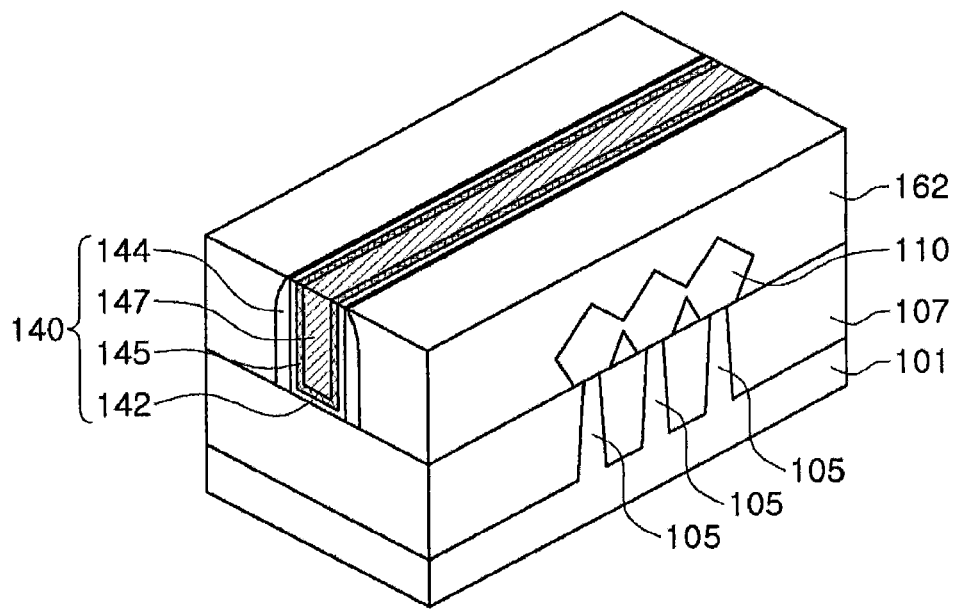

Referring to FIG. 17, a gate structure 140 may be formed by forming a gate insulating layer 142 and first and second gate electrodes 145 and 147 within the opening E.

The gate insulating layer 142 may be formed substantially in a conformal manner along the sidewalls and the lower surface of the opening E. The gate insulating layer 142 may include an oxide, a nitride and/or a high-k material.

The first and second gate electrodes 145 and 147 may include a metal or a semiconductor material.

FIGS. 18A to 22B illustrate a perspective view along with a cross section cut along line X-X'.

Figure 18A:
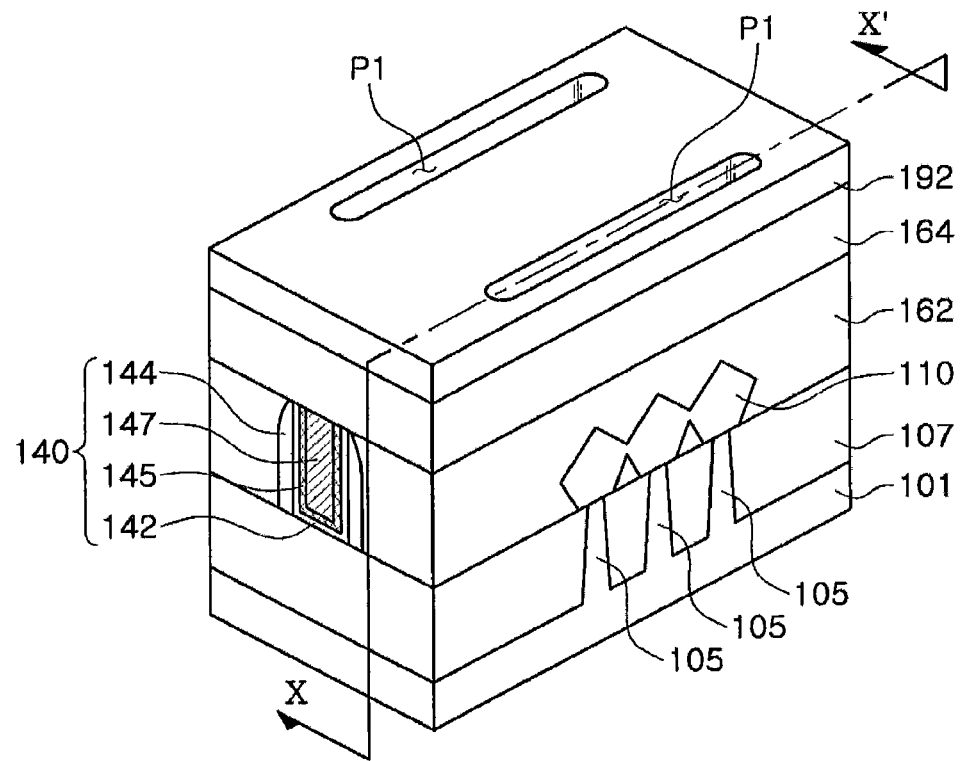
Figure 18B:
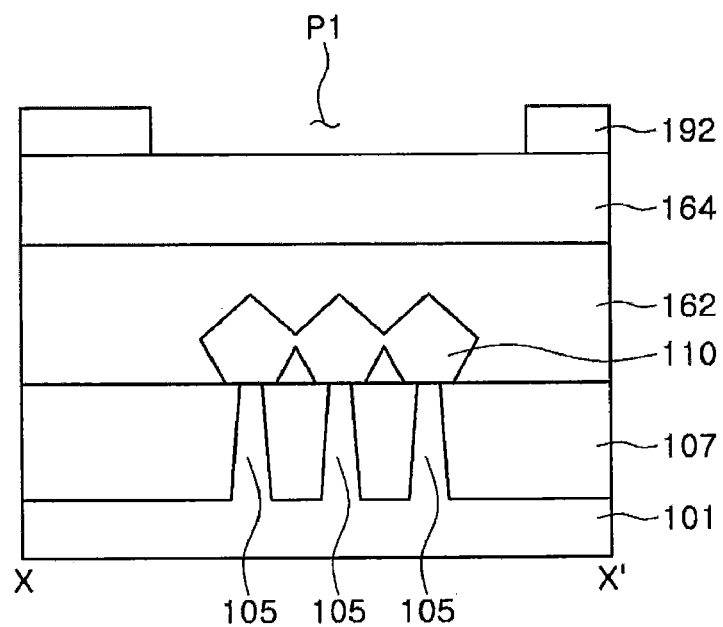

Referring to FIGS. 18A and 18B, a second interlayer insulating layer 164 on, and in some embodiments covering, the first and second gate electrodes 145 and 147 and a source/drain region 110, and a first mask layer 192 having a first open region P1, may be formed.

The second interlayer insulating layer 164 may include, for example, at least one oxide, nitride and/or oxynitride. The second interlayer insulating layer 164 may be formed of the same material as the first interlayer insulating layer 162.

The first mask layer 192 may be a layer for patterning the first and second insulating layers 162 and 164. The first mask layer 192 may be, for example, a photoresist layer. The first mask layer 192 may expose the second interlayer insulating layer 164 through a first open region P1. The length of the first open region P1 in an extending direction of the first and second gate electrodes 145 and 147 may be shorter than a length L4 (see FIG. 1), the length of the contact plugs 170F and 170S.

Figure 19A:
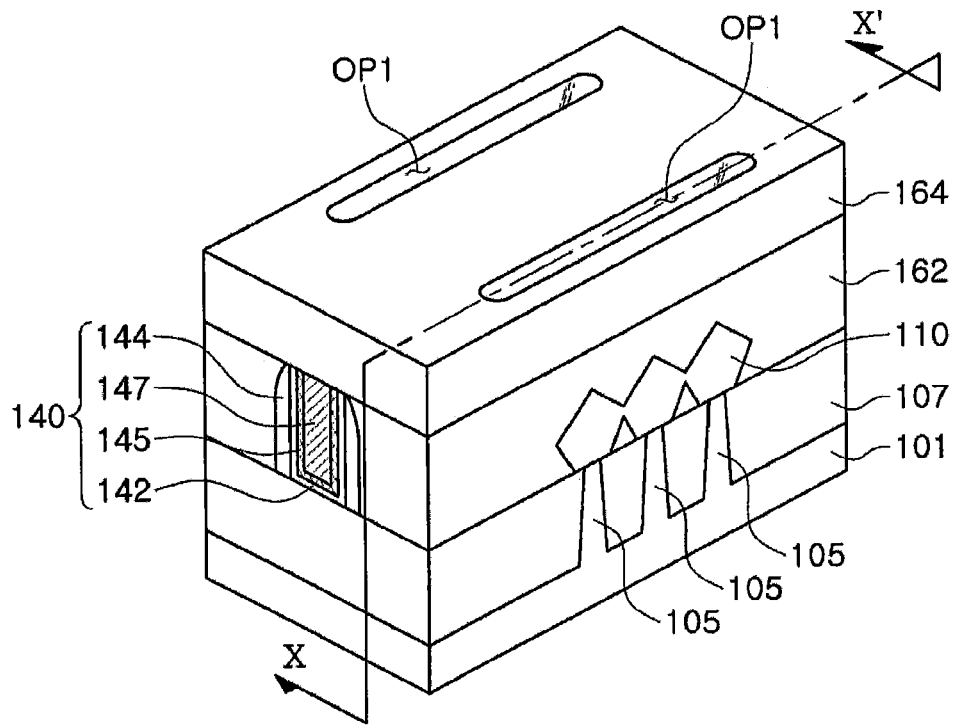
Figure 19B:
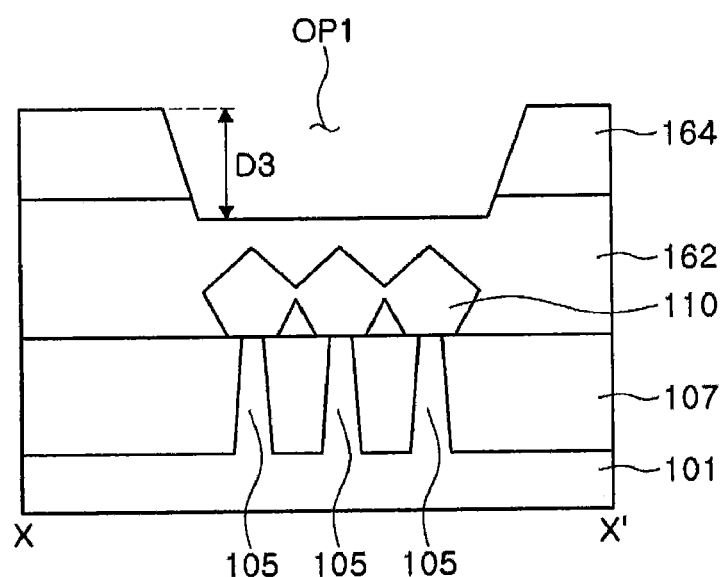

Referring to FIGS. 19A and 19B, first and the second interlayer insulating layers 162 and 164 may be patterned using the first mask layer 192.

A first etching region OP1 may be formed by removing the second interlayer insulating layer 164 exposed through the first open region P1, and removing the first interlayer insulating layer 162 exposed after removing the second interlayer insulating layer 164.

The first etching region OP1 may be formed to have a predetermined depth D3 from the upper surface of the second interlayer insulating layer 164. The depth D3 of the first etching region OP1 may be less than the depth to the source/drain region 110, but is not limited thereto, and may be modified in various ways.

Figure 20A:
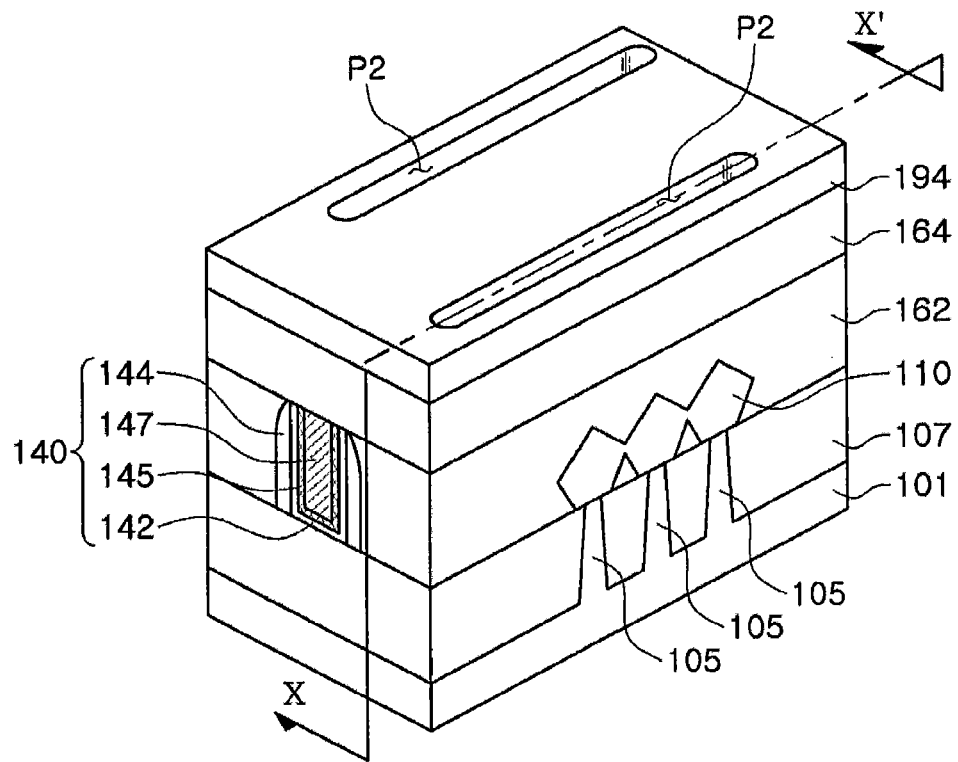
Figure 20B:
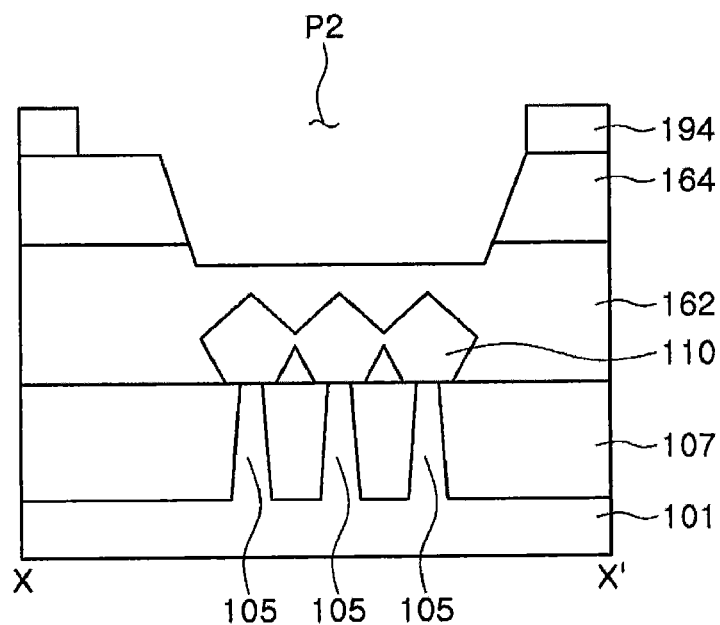

Referring to FIGS. 20A and 20B, a second mask layer 194 having a second open region P2 may be formed.

The second mask layer 194 may be a layer for patterning the first and second interlayer insulating layers 162 and 164. The second mask layer 194 may be, for example, a photoresist layer. The second mask layer 194 may expose portions of the first etching region OP1 and the second interlayer insulating layer 164 adjacent to the first etching region OP1 through the second open region P2. The length of the second open region P2 in an extending direction of the first and second gate electrodes 145 and 147 may be substantially the same as the length L4 (see FIG. 1), the length of the contact plugs 170F and 170S.

In an example embodiment of the present inventive concepts, the second mask layer 194 may not be a layer separate from the above-mentioned first mask layer 192 with reference to FIGS. 18A and 18B, but may be a layer formed by enlarging the first open region P1 of the first mask layer 192 using a trimming process.

For example, the semiconductor device 100a as described above with reference to FIG. 4 may be manufactured using such a trimming process. In this case, in the contact plug 170Fa, the second region of the upper portion of the step surfaces Spa and SPb may have a width expanded also in the y-direction, not illustrated, further than the width of the first region of the lower portion. The semiconductor device 100a of the example embodiment of the present inventive concepts in FIG. 4, in this case, may be formed by adjusting the location and width of the second open region P2. In detail, the semiconductor device 100a having step portions formed on both sides of the device as illustrated in FIG. 4 may be manufactured by the second open region P2 in FIG. 20B being formed to expose the second interlayer insulating layer 164 on the right side as well.

Figure 21A:
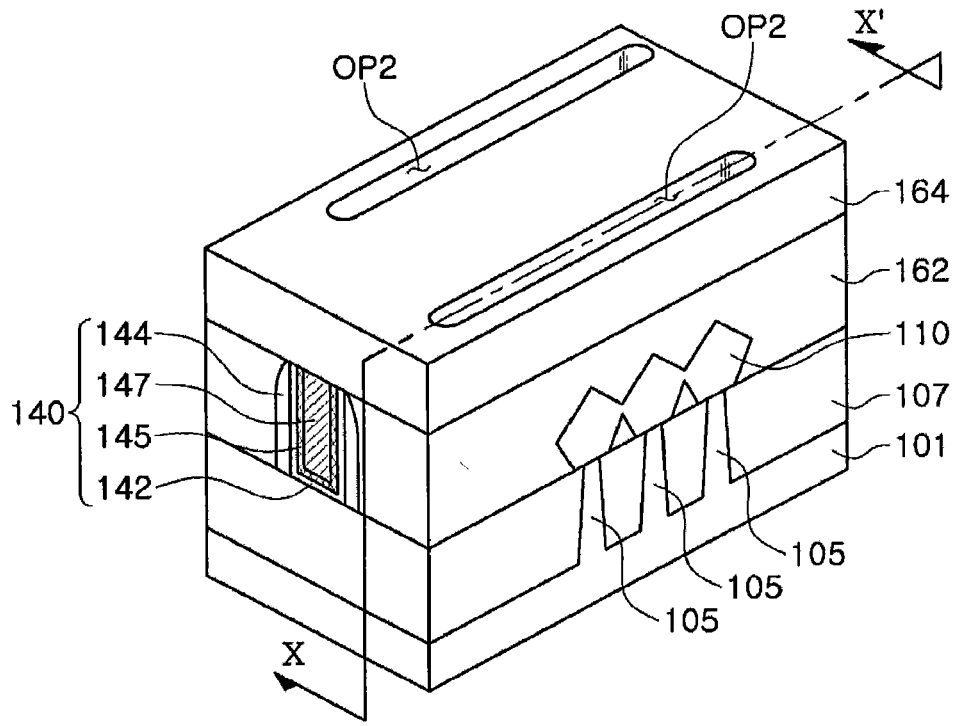
Figure 21B:
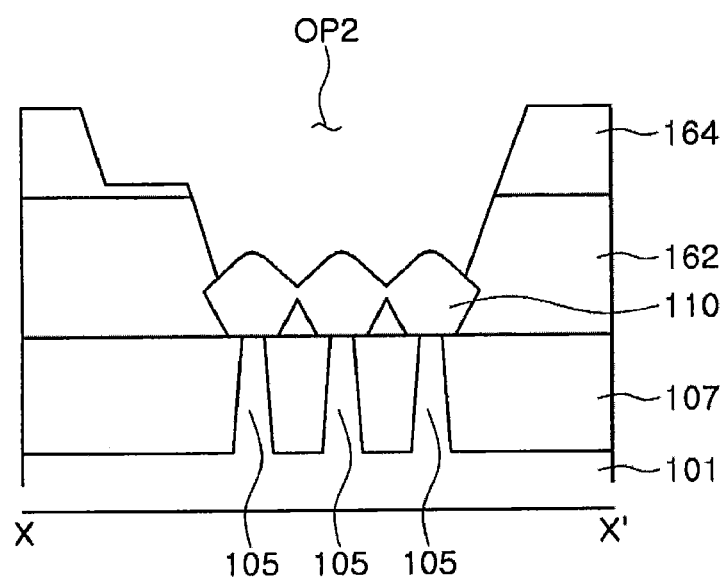

Referring to FIGS. 21A and 21B, first and second interlayer insulating layers 162 and 164 may be patterned using a second mask layer 194.

A second etching region OP2 may be formed by removing the exposed first and second interlayer insulating layers 162 and 164 through a second open region P2. At least a portion of the upper and side surfaces of the source/drain region 110 may be exposed through the second etching region OP2. A portion of the exposed source/drain region 110 from the upper surface may be removed during an etching process, and a portion of the upper surface may have a curved surface from being etched as illustrated. The second etching region OP2 may be an expanded region of the first etching region OP1, and a step portion may be formed between the region where the first etching region OP1 was formed and the surrounding regions. The height of the step portion may vary depending on the relative etched depths in the first and the second etching regions OP1 and OP2.

In the example embodiment of the present inventive concepts, over-etching of the first interlayer insulating layer 162 to the sides of the source/drain region 110 during an etching process may be reduced or prevented, by sequentially forming the first and second etching regions OP1 and OP2 having different sizes from each other through two etching processes, compared to forming an opening exposing the upper surface of the source/drain region 110 in just one process. Therefore, since the etched depth may be easily adjusted, the contact plugs 170F and 170S may be controlled so that the depth thereof may not be formed unnecessarily deeply or extended to the substrate 101 in the rear.

Figure 22A:
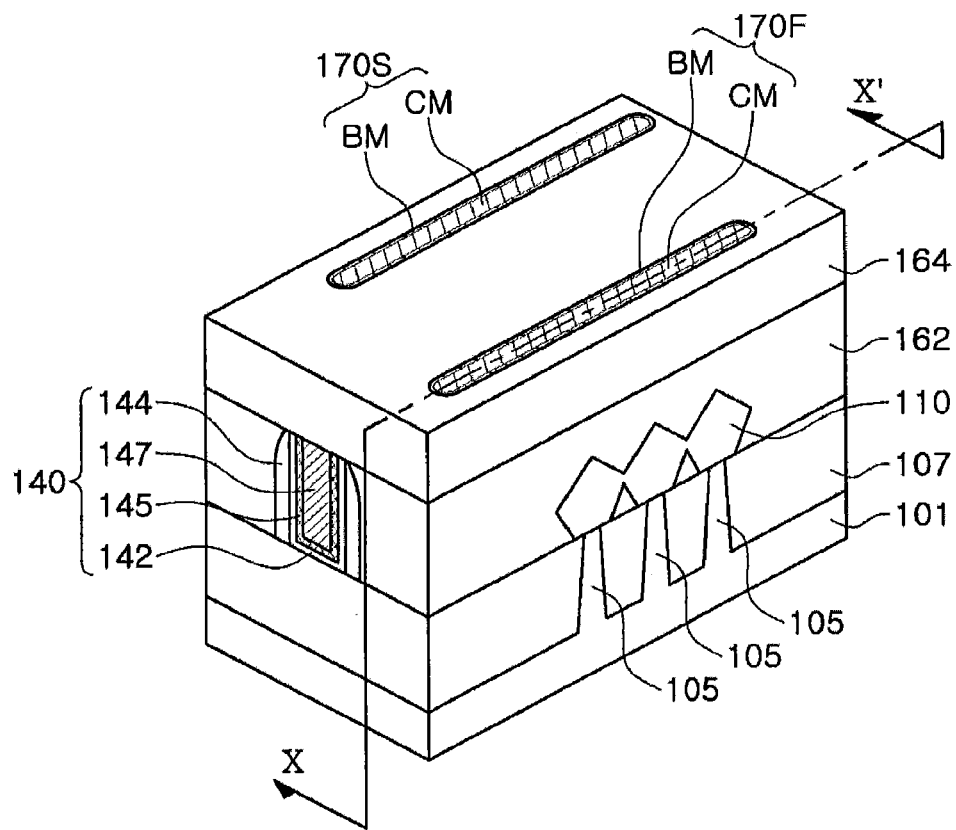
Figure 22B:
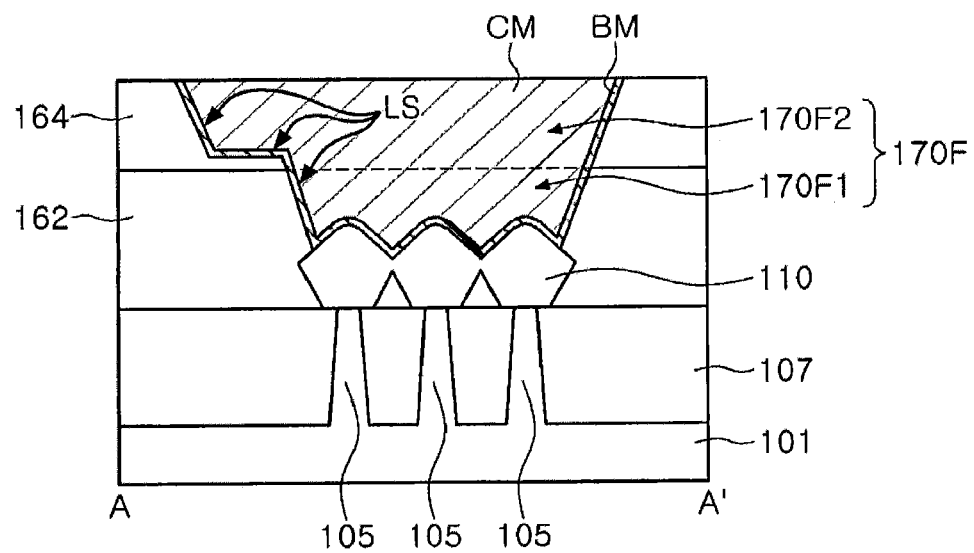

Referring to FIGS. 22A and 22B, contact plugs 170F and 170S may be formed by providing a conductive material in, and in some embodiments filling, a second etching region OP2.

The contact plug 170F, for convenience of explanation, may be distinguished as a first region 170F1 of the lower portion, and a second region 170F2 of the upper portion, based on the step portion. The step portion may be formed by the second region 170F2 being extended longer than the first region 170F1 from one side of the contact plug 170F. In the formation of the contact plug 170F, first, a barrier layer BM may be formed, and a conductive layer CM may be formed on the barrier layer BM. The contact plug 170F may also be regarded as having at least one side that comprises a plurality of line segments LS, when viewed in cross-section.

Next, with reference to FIG. 3A, wiring lines 180F crossing one side of the contact plugs 170F may be formed. By the step portion, the contact plugs 170F may be stably connected to the wiring lines 180F by being extended outwardly of the source/drain region 110 in one direction.

FIGS. 23 to 26 are views illustrating a process sequence to illustrate a method of manufacturing a semiconductor device according to example embodiments of the present inventive concepts. FIGS. 23 to 26 illustrate processes after the above-described processes with reference to FIGS. 10 to 17.

Figure 23:
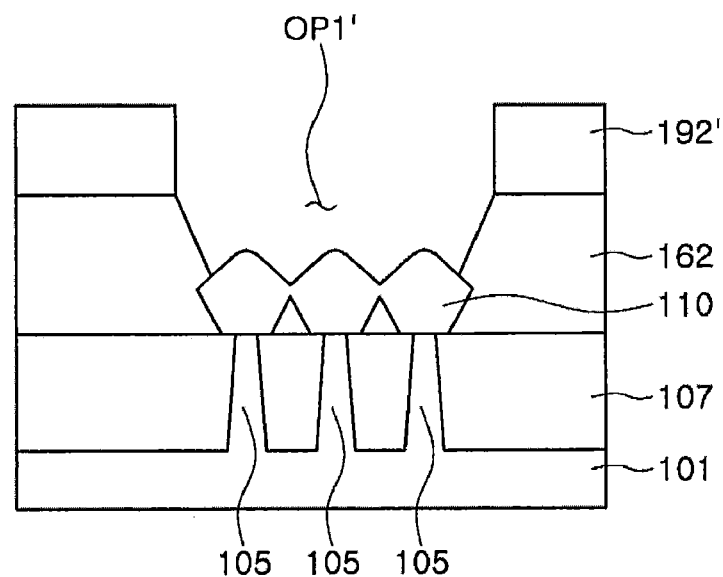
FIGS. 23 to 26 are views illustrating a process sequence to illustrate a method of manufacturing a semiconductor device according to example embodiments of the present inventive concepts.

Referring to FIG. 23, a first mask layer 192' may be formed, and a first interlayer insulating layer 162 may be patterned using the first mask layer 192'.

The first interlayer insulating layer 162 on the source/drain region 110 may be exposed by the first mask layer 192'. Thus, a first etching region OP1' may be formed by removing the exposed first interlayer insulating layer 162. The source/drain region 110 may be exposed through the first etching region OP1'.

Figure 24:
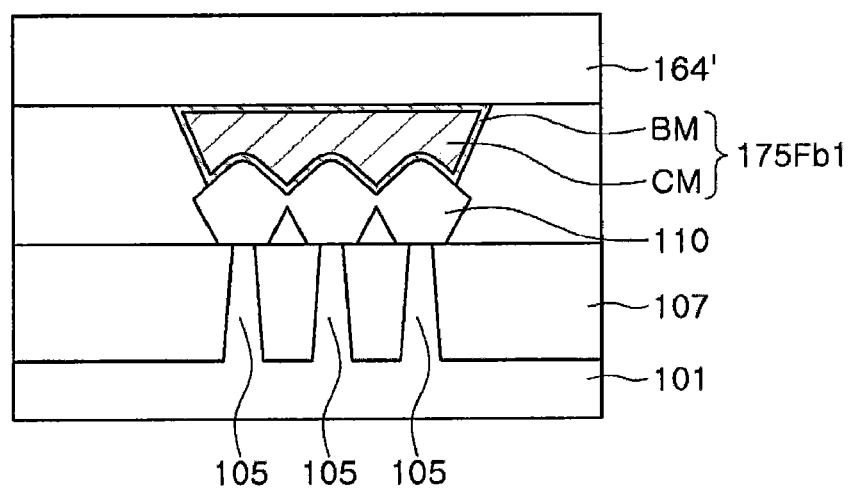

Referring to FIG. 24, a first region 170Fb1 of the contact plug 170Fb (see FIG. 5) may be formed by providing a conductive material in, and in some embodiments filling, a first etching region OP1'. The first region 170Fb1 may include a barrier layer BM and a conductive layer CM. The barrier layer BM may be formed first. Afterwards, the conductive layer CM may be formed, and the barrier layer BM may be formed again on the upper surface of the conductive layer CM.

Next, a second interlayer insulating layer 164' on, and in some embodiments covering, the first region 170Fb1 may be formed. As necessary, prior to the formation of the second interlayer insulating layer 164', a flattening process may be further performed.

Figure 25:
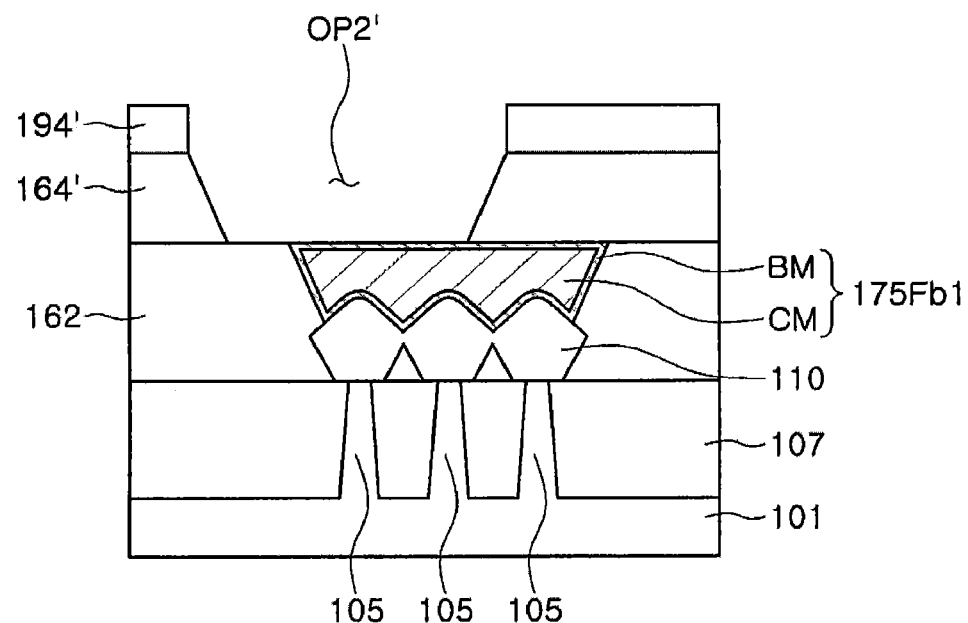

Referring to FIG. 25, a second interlayer insulating layer 164' may be patterned using a second mask layer 194'.

A second etching region OP2' may be formed by removing the second interlayer insulating layer 164' exposed by the second mask layer 194'. The second etching region OP2' may expose a first region 170Fb1 of the contact plug 170Fb.

The second etching region OP2' may expose a portion of the first region 170Fb 1, and may be formed to be shifted toward one direction based on a source/drain region 110. In one example embodiment of the present inventive concepts, a barrier layer BM exposed through the second etching region OP2' may also be at least partially removed.

Figure 26:
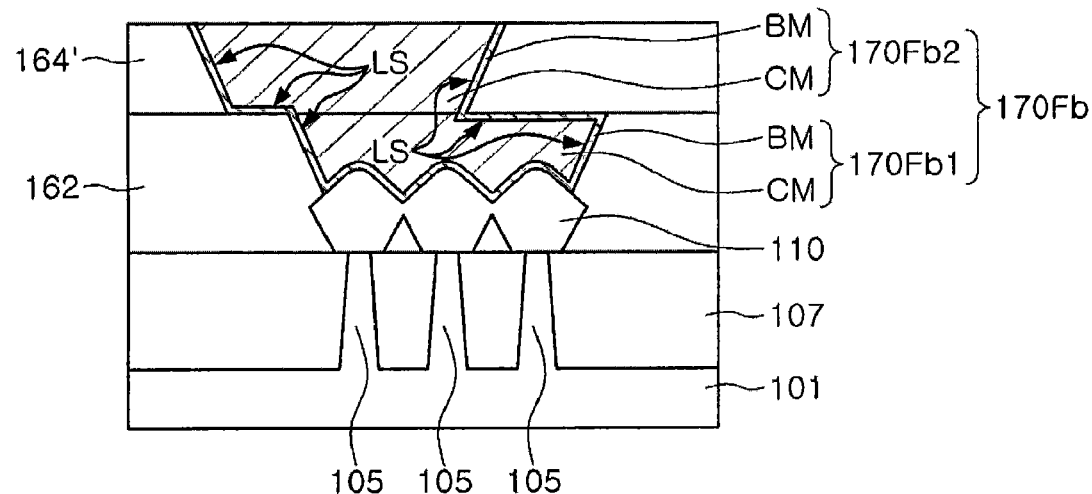

Referring to FIG. 26, a second region 170Fb2 of a contact plug 170Fb may be formed by filling a second etching region OP2' with a conductive material.

The second region 170Fb2 may include a barrier layer BM and a conductive layer CM. The barrier layer BM may be formed first, and the conductive layer CM may be formed afterwards. In detail, the barrier layer BM may be prevented from forming on the upper surface of a first region 170Fb1 where the second region 170Fb2 is formed, or may be removed after formation. However, the shape and disposition of the barrier layer BM are not limited thereto, and may be modified in various ways.

Thereby, a contact plug 170Fb including the first and second regions 170Fb1 and 170Fb2 may be formed. Step portions may be formed on both sides of the contact plug 170Fb above the source/drain region 110. One of the step portions may be formed to narrow toward a substrate 101, and the other may be formed to widen. The contact plug 170Fb may also be regarded as having at least one side that comprises a plurality of line segments LS, when viewed in cross-section.

Next, with reference to FIG. 5, a wiring line 180F passing one side of the contact plug 170Fb may be formed. The contact plug 170F may be stably connected to the wiring line 180F by being extended outwardly of the source/drain region 110 in one direction while securing a contact region with the source/drain region 110 by the step portions.

Using the above-mentioned manufacturing method with reference to FIGS. 23 to 26, semiconductor devices 100c and 100d of FIGS. 6 and 7 of the example embodiment of the present inventive concepts may be manufactured. For example, the semiconductor device 100c of FIG. 6 may be manufactured by carrying out the process described above with reference to FIGS. 25 and 26 once more. The semiconductor device 100d of FIG. 7 may be manufactured by controlling an etching process so that the side surface thereof may be etched perpendicularly, and by adjusting an etching region during the formation of first and a second etching regions OP1' and OP2'.

Figure 27:
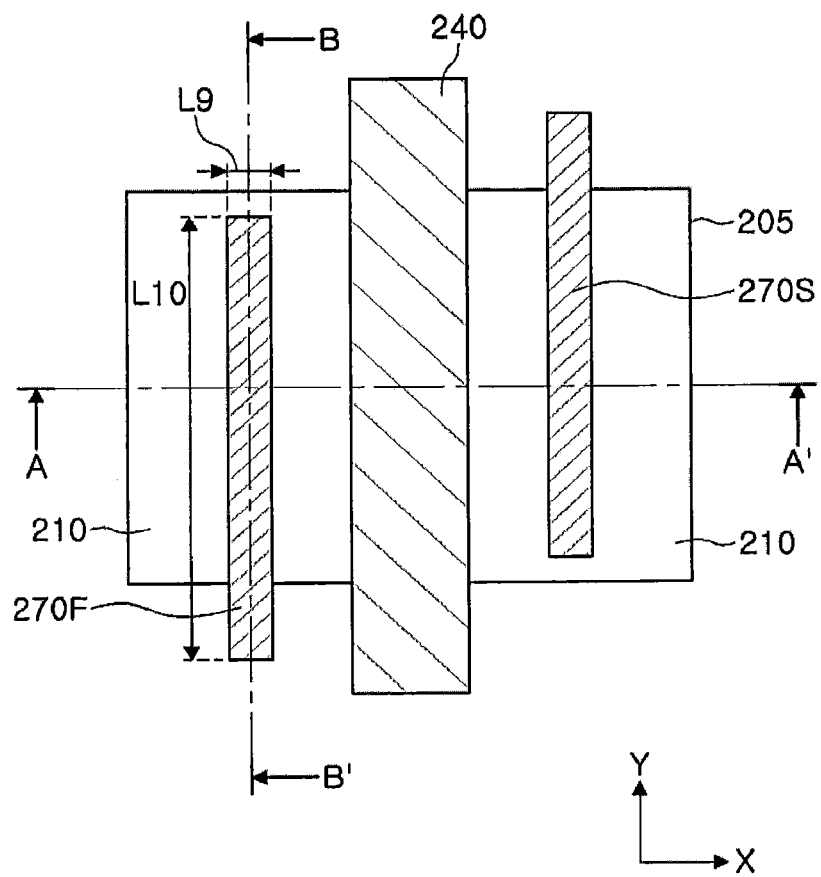
FIGS. 27 to 28B are a plan view and cross-sectional views of a semiconductor device according to example embodiments of the present inventive concepts.
Figure 28A:
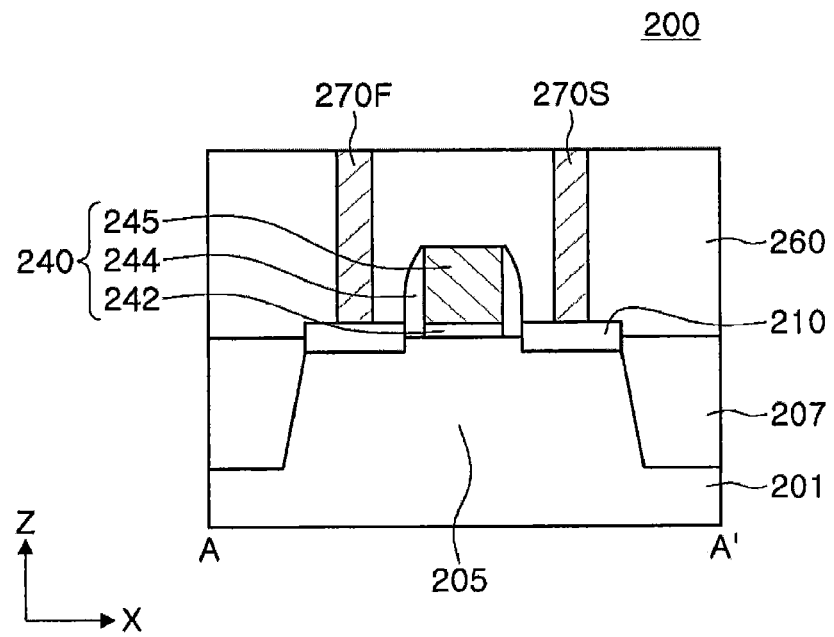
Figure 28B:
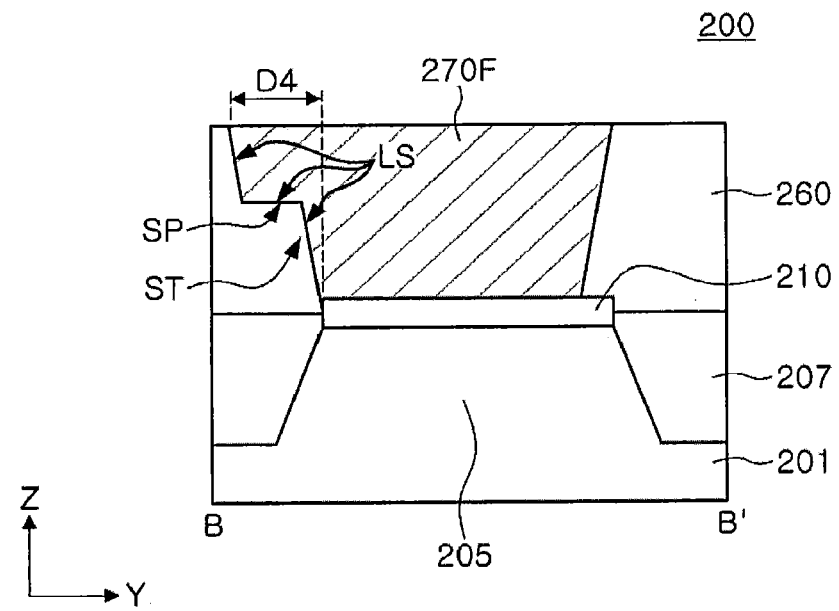

FIGS. 27 to 28B are a top view and a cross-sectional view of a semiconductor device according to an example embodiment of the present inventive concepts. FIGS. 28A and 28B illustrate a section along lines A-A' and B-B' in FIG. 27, respectively.

Referring to FIGS. 27 to 28B, the semiconductor device 200 may include a substrate 201, an active region 205 extending in a first direction, for example, an x-direction on the substrate 201, source/drain regions 210 on the active region 205, a gate structure 240 extending in a second direction, for example, a y-direction, and contact plugs 270F and 270S. The semiconductor device 200 may further include isolation layers 207 and an interlayer insulating layer 260.

The semiconductor device 200 of the example embodiment of the present inventive concepts may be a planar transistor having a flat upper surface without the active region 205 being projected toward the gate structure 240, unlike the semiconductor device 100 of FIGS. 1 to 3B.

The substrate 201 may have an upper surface extending in x and y directions. The substrate 201 may include a semiconductor material, such as a group IV semiconductor material, a group III-V compound semiconductor material, or a group II-IV oxide semiconductor material.

The isolation layers 207 may be formed of an insulating material. The isolation layers 207 may be formed of, for example, an oxide, a nitride, or a combination of both. The active area 205 may be defined by the isolation layers 207 in the substrate 201. The active region 205 may be recessed and the source/drain regions 210 may be disposed on the side surface of the gate structure 240.

The source/drain regions 210 may be disposed on the active region 205 from both sides of the gate structure 240. The source/drain regions 210 may be in an elevated source/drain form in which the upper surface of the source/drain regions 210 is located higher than the lower surface of the gate structure 240. The source/drain regions 210 may be provided as source/drain regions of the semiconductor device 200. However, the source/drain regions 210 in the present inventive concepts are not limited to the elevated form, and in other example embodiments of the present inventive concepts, the source/drain regions 210 of the semiconductor device 200 may be formed as impurity regions within the active region 205.

The gate structure 240 may disposed to intersect the active region 205 on the upper portion of the active region 205, and may include a gate insulating layer 242, a gate electrode 245, and spacers 244. The gate insulating layer 242 may be formed of an oxide, a nitride and/or an oxynitride. The gate electrode 245 may include a metal, a metal nitride and/or a doped polysilicon. The spacers 244 may be disposed on both sides of the gate electrode 245. The spacer 244 may be formed of an oxide, a nitride, or an oxynitride, and may be formed of a multi-layer film.

An interlayer insulating layer 260 may be disposed on, and in some embodiments to cover, the substrate 201, the source/drain regions 210 and the gate structure 240. The interlayer insulating layer 260 may be formed of an insulating material, such as at least one of an oxide film, a nitride film, and an oxynitride film.

The contact plugs 270F and 270S may be disposed on the source/drain regions 210, and may electrically connect the source/drain regions 210 and a wiring structure of the upper portion by penetrating the interlayer insulating layer 260. One ends of the contact plugs 270F and 270S may be extended outwardly of the source/drain regions 210 by a predetermined length D4 in the y-direction from one ends of the source/drain regions 210. The length D4 may be determined according to the disposition of the wiring structure. The contact plugs 270F and 270S, by such a structure, may be connected to the wiring structure which is spaced apart in the y-direction from the source/drain regions 210.

The contact plugs 270F and 270S may have an extended shape in an extended direction of the gate structure 240, for example, in the y-direction, and may have a rectangular shape, an oval shape, or the like. A ninth length L9, a length in the x direction, may be shorter than a tenth length L10, a length in the y-direction. For example, the tenth length L10 may be three times longer or more than the ninth length L9.

The two sides of the contact plugs 270F and 270S may have an asymmetric shape in the y-direction above the source/drain regions 210. For example, one side of the contact plugs 270F and 270S may have a side perpendicular to the source/drain regions 210, or may be continuously extended having a gradient, and another side of the contact plugs 270F and 270S may have a step-shaped step portion ST. The step portion ST may be located outwardly of the source/drain regions 210. The step portion ST may include a step surface SP being perpendicular to the upper surface of the substrate 201 or having a gradient. The step surface SP may be located outwardly of the source/drain regions 210 in the y-direction. The contact plugs 270F and 270S may also be regarded as having at least one side that comprises a plurality of line segments LS, when viewed in cross-section.

The contact plugs 270F and 270S may be on, and in some embodiments cover, portions of the upper and side surfaces of the source/drain regions 210. However, the example embodiment of the present inventive concepts is not limited thereto, and in other example embodiments of the present inventive concepts, the contact plugs 270F and 270S may be on, and in some embodiments may cover, only the upper surface of the source/drain regions 210.

The contact plugs 270F and 270S may include a conductive material such as aluminum (Al), copper (Cu), tungsten (W) and/or the like.

Figure 29:
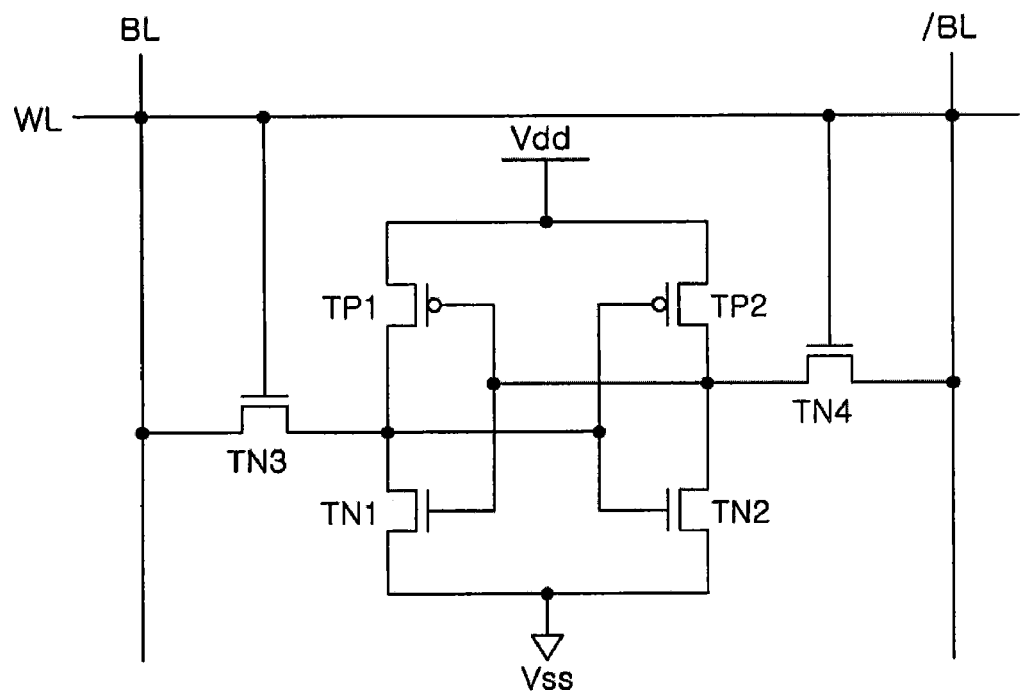
FIG. 29 is a circuit diagram of an SRAM cell including a semiconductor device according to example embodiments of the present inventive concepts.

FIG. 29 is a circuit diagram of an SRAM cell including a semiconductor device according to example embodiments of the present inventive concepts.

Referring to FIG. 29, a cell in SRAM elements may include first and second drive transistors TN1 and TN2, first and second load transistors TP1 and TP2, and first and second access transistors TN3 and TN4. Here, a source of the first and second drive transistors TN1 and TN2 may be connected to a ground voltage line Vss, and a source of the first and second load transistors TP1 and TP2 may be connected to a power supply voltage line Vdd.

The first drive transistor TN1 including a NMOS transistor and the second load transistor TP1 including a PMOS transistor may provide a first inverter, and the second drive transistor TN2 including a NMOS transistor and the second load transistor TP2 including a PMOS transistor may provide a second inverter. The first and/or second drive transistors TN1 and/or TN2, the first and/or second load transistors TP1 and/or TP2, and/or the first and/or second access transistors TN3 and/or TN4 may include the semiconductor device according to various example embodiments of the present inventive concepts as described above with reference to FIGS. 1 to 9 and FIGS. 27 to 28B.

An output terminal of the first and second inverters may be connected to the source of the first access transistor TN3 and the second access transistor TN4. Further, an input terminal and the output terminal of the first and second inverters may be connected by intersecting each other to configure a single latch circuit. Also, a drain of the first and second access transistors TN3 and TN4 may be connected to first and second bit lines BL and/BL, respectively.

Figure 30:
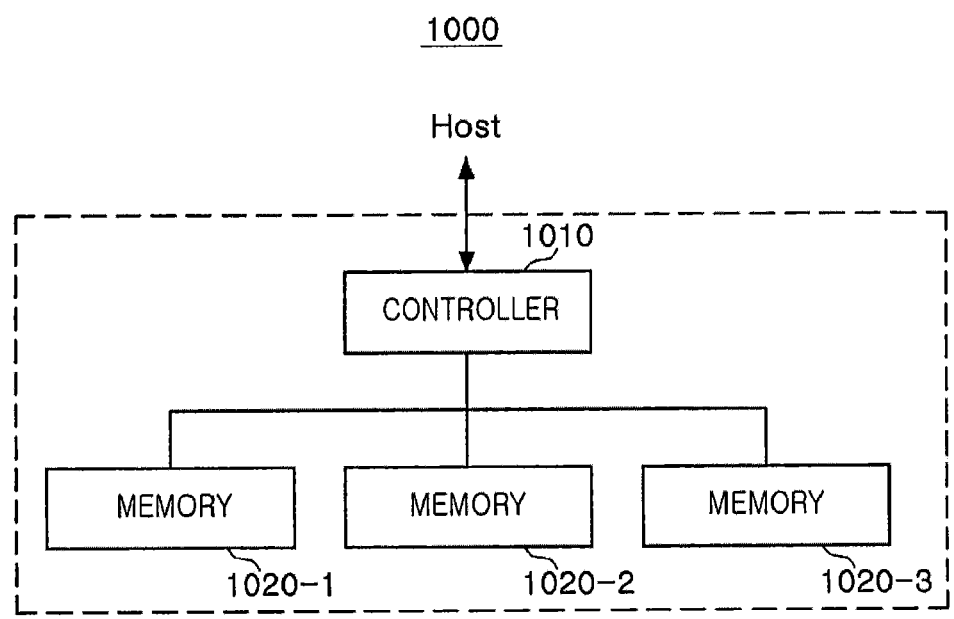
FIG. 30 is a block diagram illustrating a storage device including a semiconductor device according to example embodiments of the present inventive concepts.

FIG. 30 is a block diagram illustrating a storage device including a semiconductor device according to example embodiments of the present inventive concepts.

Referring to FIG. 30, a storage device 1000 according to the example embodiment of the present inventive concepts may include a controller 1010 communicating with a host, and memories 1020-1, 1020-2, and 1020-3 storing data. Each memory 1020-1, 1020-2 and/or 1020-3, and/or the controller 1010 may include the semiconductor device according to various example embodiments of the present inventive concepts as described above with reference to FIGS. 1 to 9 and FIGS. 27 to 28B.

The host communicating with the controller 1010 may be a variety of electronic devices provided with the storage device 1000, for example, a smart phone, a digital camera, a desktop computer, a laptop computer, a media player, or the like. The controller 1010 may receive and store writing data or read requests transmitted from the host to the memories 1020-1, 1020-2, and 1020-3, or may generate a command to retrieve data from the memories 1020-1, 1020-2, and 1020-3.

As illustrated in FIG. 30, one or more of the memories 1020-1, 1020-2, and 1020-3 may be connected in parallel to the controller 1010 in the storage device 1000. By connecting a plurality of memories 1020-1, 1020-2, and 1020-3 in parallel to the controller 1010, the storage device 1000 having a large capacity such as an SSD (Solid State Drive) may be realized.

Figure 31:
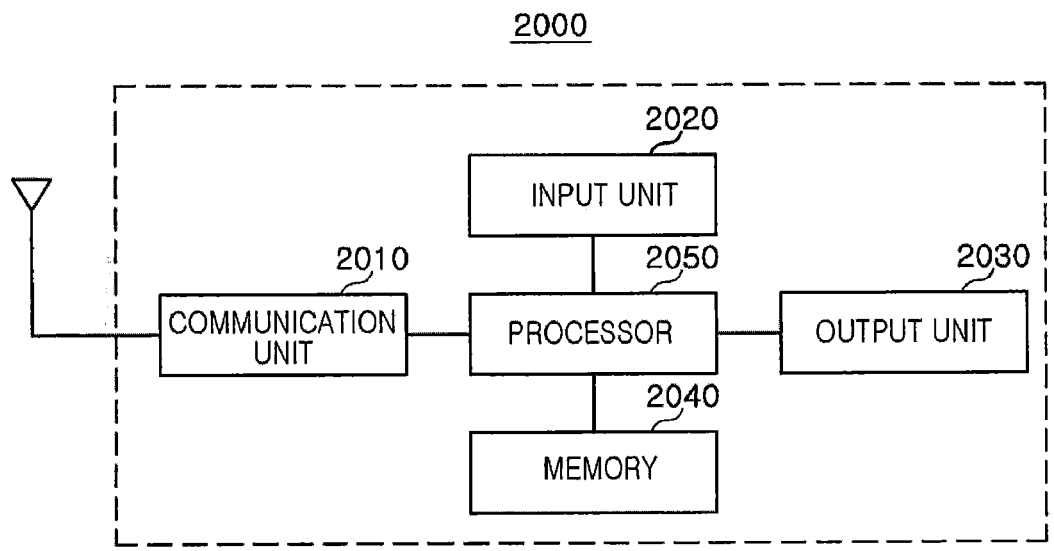
FIG. 31 is a block diagram illustrating an electronic apparatus including a semiconductor device according to example embodiments of the present inventive concepts.

FIG. 31 is a block diagram illustrating an electronic apparatus including a semiconductor device according to example embodiments of the present inventive concepts.

Referring to FIG. 31, an electronic device 2000, according to the example embodiment of the present inventive concepts, may include a communication unit 2010, an input unit 2020, an output unit 2030, a memory 2040, and a processor 2050.

The communication unit 2010 may include a wired/wireless communication module, and a wireless internet module, a short-range communication module, a GPS module and/or a mobile communication module. The wired/wireless communication module included in the communication unit 2010 may transmit and receive data by being connected to an external communication network by a variety of communications standards.

The input unit 2020 is a module provided for the user to control operations of the electronic device 2000, and may include a mechanical switch, a touch screen, a voice recognition module and/or the like. Further, the input unit 2020 may include a mouse operating in a trackball and/or a laser pointer method and the like and/or a finger mouse device, and may further include a variety of sensor modules allowing the user to input data.

The output unit 2030 may output information processed by the electronic device 2000 in the form of sound and/or video, and the memory 2040 may store a program for process and control of the processor 2050, or data. The processor 2050 may store or retrieve data by transmitting a command to the memory 2040 according to the required action.

The memory 2040 may be provided in the electronic device 2000 or may communicate with the processor 2050 via a separate interface. When communicating with the processor 2050 via a separate interface, the processor 2050 may store or retrieve data from the memory 2040 via a variety of interface standards, such as SD, SDHC, SDXC, MICRO SD and/or USB.

The processor 2050 may control operations of each unit included in the electronic device 2000. The processor 2050 may perform control and processes related to voice calling, video calling, data communications and/or the like, and/or may also perform control and processes for multimedia playback and management. Further, the processor 2050 may process input transmitted from the user via the input unit 2020, and may output the results via the output unit 2030. In addition, the processor 2050, as previously described, may store data necessary in controlling the operation of the electronic device 2000 in the memory 2040, or retrieve the data from the memory 2040. The processor 2050, the memory 2040 and/or any of the other units of FIG. 31 may include the semiconductor device according to various example embodiments of the present inventive concepts as described above with reference to FIGS. 1 to 9 and FIGS. 27 to 28B.

Figure 32:
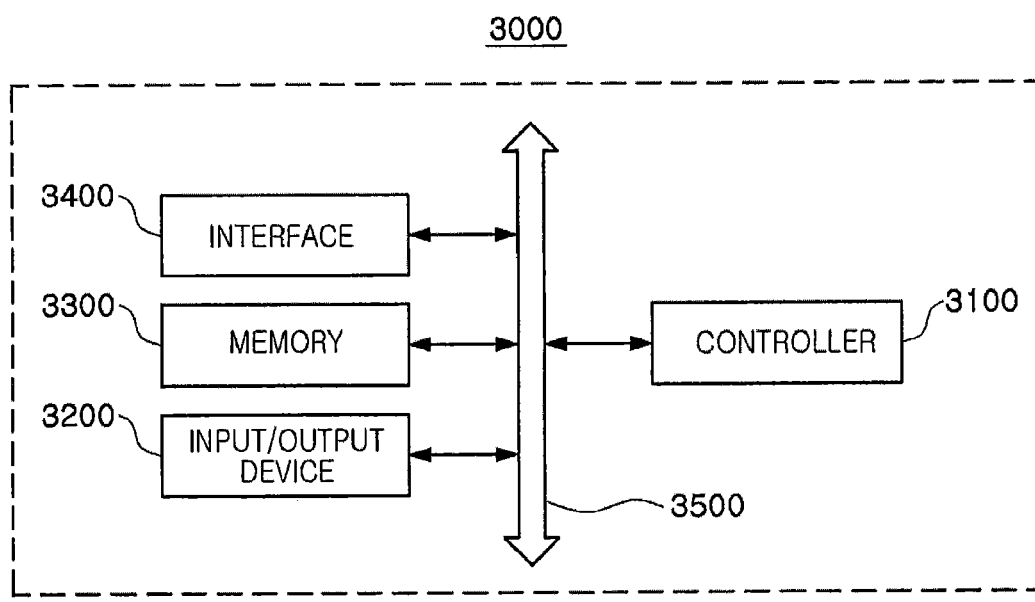
FIG. 32 is a schematic diagram illustrating a system including a semiconductor device according to example embodiments of the present inventive concepts.

FIG. 32 is a schematic diagram illustrating a system including a semiconductor device according to example embodiments of the present inventive concepts.

Referring to FIG. 32, a system 3000 may include a controller 3100, an input/output device 3200, a memory 3300 and an interface 3400. The system 3000 may be a mobile system and/or a system transmitting and/or receiving information. The mobile system may be a PDA, a portable computer, a web tablet, a wireless phone, a mobile phone, a digital music player and/or a memory card.

The controller 3100 may run a program and/or control the system 3000. The controller 3100 may be, for example, a microprocessor, a digital signal processor, a microcontroller and/or a similar device.

The input/output device 3200 may be used to input or output data of the system 3000. The system 3000 may be connected to an external device, such as a personal computer and/or a network using the input/output device 3200, and may exchange data with the external device. The input/output device 3200 may be, for example, a keypad, a keyboard and/or a display device.

The memory 3300 may store a code and/or data for the operation of the controller 3100, and/or may store data processed by the controller 3100. The memory 3300 and/or any of the other blocks of FIG. 32 may include the semiconductor device according to any one of the example embodiments of the present inventive concepts.

The interface 3400 may be a data transmission path between the system 3000 and other external devices. The interface 3400 may communicate with the controller 3100, the input/output device 3200, and the memory 3300 via a bus 3500.

The controller 3100, the memory 3300 and/or any of the other blocks of FIG. 32 may include at least one of the semiconductor devices according to various example embodiments of the present inventive concepts as described above with reference to FIGS. 1 to 9 and FIGS. 27 to 28B.

As set forth above, by forming step portions on sides of contact plugs, a semiconductor device may have improved degree of integration and reliability, and a method of manufacturing the same may also be provided.

While example embodiments have been shown and described above, it will be apparent to those skilled in the art that modifications and variations could be made without departing from the scope of the present inventive concepts as defined by the appended claims.

What is claimed is:

1. A semiconductor device comprising:
a substrate;
a plurality of fins including a first fin and a second fin on the substrate;
an isolation layer on the substrate and between the first fin and the second fin;
a gate structure on the plurality of fins and on the isolation layer;
a plurality of source/drains including a first source/drain on the first fin and a second source/drain on the second fin;
a contact on the first source/drain and on the second source/drain, the contact directly contacting both an upper surface of the first source/drain and an upper surface of the second source/drain; and
a wiring line at least partially on the contact,
wherein the contact electrically connects the first source/drain and the wiring line and electrically connects the second source/drain and the wiring line,
the contact is spaced apart from both the first fin and the second fin,
a width of a widest portion of the contact is greater than a sum of a width of the first source/drain and a width of the second source/drain,
a width of an upper portion of the contact is greater than a width of a lower portion of the contact,
the gate structure includes a gate insulating layer and a gate electrode on the gate insulating layer,
an upper surface of the wiring line is at a higher level than an upper end of the contact,
a lower surface of the wiring line is at a higher level than an upper surface of the gate electrode,
a bottom surface of the contact is farther from an upper surface of the substrate than both a bottom surface of the first source/drain and a bottom surface of the second source/drain, and
at least a portion of a first sidewall of the contact is inclined with respect to the upper surface of the substrate,
wherein the first fin and the second fin are spaced apart from each other in a horizontal direction that is parallel to the upper surface of the substrate, and
the contact is asymmetrically shaped with respect to a vertical line that is perpendicular to the upper surface of the substrate and passes through a center of the contact in the horizontal direction.

2. The semiconductor device of claim 1, wherein the first source/drain directly contacts the second source/drain.

3. The semiconductor device of claim 1, wherein the plurality of fins further include a third fin,
the plurality of source/drains further include a third source/drain on the third fin, and
the width of the widest portion of the contact is greater than a sum of the width of the first source/drain, the width of the second source/drain, and a width of the third source/drain.

4. The semiconductor device of claim 1, further comprising an insulating layer on the isolation layer,
wherein the first sidewall of the contact includes a stepped portion, and
an entirety of the first sidewall of the contact directly contacts the insulating layer.

5. The semiconductor device of claim 1, wherein the wiring line does not vertically overlap the plurality of source/drains.

6. The semiconductor device of claim 1, wherein:
the contact includes a conductive pattern and a barrier layer directly contacting the conductive pattern;
the barrier layer covers a bottom surface and side surfaces of the conductive pattern;
the side surfaces of the conductive pattern include a first side surface, a second side surface, and a third side surface;
the second side surface is at a higher level than the first side surface;
a lowermost end of the second side surface is spaced apart from an uppermost end of the first side surface in the horizontal direction;
the third side surface extends in the horizontal direction and connects the lowermost end of the second side surface to the uppermost end of the first side surface;
the second side surface does not overlap the first side surface in a vertical direction that is perpendicular to the upper surface of the substrate; and
the second side surface does not overlap the plurality of source/drains in the vertical direction.

7. The semiconductor device of claim 6, wherein at least a portion of the first side surface of the conductive pattern overlaps a portion of the plurality of source/drains in the vertical direction.

8. The semiconductor device of claim 1, wherein a lowermost end of the contact directly contacts the plurality of source/drains and is spaced apart from the isolation layer.

9. A semiconductor device comprising:
a substrate;
a plurality of fins including a first fin and a second fin on the substrate;
a first isolation layer on the substrate and between the first fin and the second fin;
a second isolation layer on the substrate, the first fin being between the first isolation layer and the second isolation layer;
a gate structure on the plurality of fins, on the first isolation layer and on the second isolation layer;
a source/drain on the first fin, the first isolation layer and the second fin;
a contact on the source/drain, the contact directly contacting an upper surface of the source/drain;
an insulating layer on the second isolation layer; and
a wiring line,
the gate structure includes a gate insulating layer and a gate electrode on the gate insulating layer,
an upper surface of the wiring line is at a higher level than an upper end of the contact,
a lower surface of the wiring line is at a higher level than an upper surface of the gate electrode,
at least a portion of the wiring line is on the contact,
the contact electrically connects the source/drain and the wiring line,
the contact is spaced apart from both the first fin and the second fin,
a width of an upper portion of the contact is greater than a width of a lower portion of the contact,
a bottom surface of the contact is higher than a bottom surface of the source/drain,
at least a portion of the upper portion of the contact vertically overlaps the second isolation layer,
at least a portion of the wiring line vertically overlaps the second isolation layer,
the contact includes a first sidewall contacting the insulating layer,
the first sidewall of the contact includes a first portion, a second portion extending from the first portion and a third portion extending from the second portion,
a slope of the first portion is steeper than a slope of the second portion,
a slope of the third portion is steeper than the slope of the second portion, and
the third portion vertically overlaps the second isolation layer.

10. The semiconductor device of claim 9, wherein the first portion and the third portion of the first sidewall of the contact are inclined with respect to an upper surface of the substrate.

11. The semiconductor device of claim 9, wherein the upper surface of the source/drain is higher than a bottom surface of the gate structure.

12. The semiconductor device of claim 9, wherein the contact entirely covers the upper surface of the source/drain.

13. The semiconductor device of claim 9, wherein a width of a widest portion of the contact is greater than a width of a widest portion of the source/drain.

14. The semiconductor device of claim 9, wherein the second portion of the contact is at a higher level than an uppermost end of the source/drain.

15. The semiconductor device of claim 9, wherein a lowermost end of the contact directly contacts the source/drain and is spaced apart from the first isolation layer and the second isolation layer.

16. A semiconductor device comprising:
a substrate;
a plurality of fins including a first fin, a second fin, and a third fin on the substrate;
an isolation layer on the substrate and between the first fin and the second fin;
a gate structure on the plurality of fins and on the isolation layer;
a plurality of source/drains including a first source/drain on the first fin, a second source/drain on the second fin, and a third source/drain on the third fin;
a contact on the first source/drain, on the second source/drain, and on the third source/drain, the contact directly contacting an upper surface of the first source/drain, an upper surface of the second source/drain, and an upper surface of the third source/drain;
an insulating layer contacting the contact; and
a wiring line extending longitudinally in a horizontal direction that is parallel to an upper surface of the substrate,
wherein the contact electrically connects the first source/drain and the wiring line, electrically connects the second source/drain and the wiring line, and electrically connects the third source/drain and the wiring line,
the contact is spaced apart from the first fin, from the second fin, and from the third fin,
a width of a widest portion of the contact is greater than a sum of a width of the first source/drain, a width of the second source/drain, and a width of the third source/drain,
a width of an upper portion of the contact is greater than a width of a lower portion of the contact,
the gate structure includes a gate insulating layer and a gate electrode on the gate insulating layer,
an upper surface of the wiring line is at a higher level than an upper end of the contact,
a lower surface of the wiring line is at a higher level than an upper surface of the gate electrode, a bottom surface of the contact is higher than a bottom surface of the first source/drain, is higher than a bottom surface of the second source/drain, and is higher than a bottom surface of the third source/drain, a first sidewall of the contact includes a stepped portion, an entirety of the first sidewall of the contact directly contacts the insulating layer, the first sidewall of the contact includes a first portion, a second portion bent from the first portion and a third portion bent from the second portion, and the third portion is at a higher level than the first portion.

17. The semiconductor device of claim 16, wherein at least a portion of the first sidewall of the contact is inclined with respect to the upper surface of the substrate.

18. The semiconductor device of claim 16, wherein a second sidewall of the contact includes a stepped portion.

19. The semiconductor device of claim 16, wherein:
the contact includes a conductive pattern and a barrier layer directly contacting the conductive pattern;
the barrier layer covers a bottom surface and side surfaces of the conductive pattern;
the side surfaces of the conductive pattern include a first side surface, a second side surface, and a third side surface;
the second side surface is at a higher level than the first side surface;
a lowermost end of the second side surface is spaced apart from an uppermost end of the first side surface in the horizontal direction;
the third side surface extends in the horizontal direction and connects the lowermost end of the second side surface to the uppermost end of the first side surface;
the second side surface does not overlap the first side surface in a vertical direction perpendicular to the upper surface of the substrate;
the second side surface does not overlap the plurality of source/drains in the vertical direction; and
at least a portion of the first side surface overlaps a portion of the plurality of source/drains in the vertical direction.

20. The semiconductor device of claim 16, wherein a lowermost end of the contact directly contacts at least one of the plurality of source/drains and is spaced apart from the isolation layer.

* * * * *